United States Patent
Yamashita et al.

(10) Patent No.: US 6,830,986 B2
(45) Date of Patent: Dec. 14, 2004

(54) SOI SEMICONDUCTOR DEVICE HAVING GETTERING LAYER AND METHOD FOR PRODUCING THE SAME

(75) Inventors: Katsushige Yamashita, Osaka (JP); Hisaji Nisimura, Shiga (JP); Hiromu Yamazaki, Kyoto (JP); Masaki Inoue, Shiga (JP); Yoshinobu Satoh, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/345,973

(22) Filed: Jan. 17, 2003

(65) Prior Publication Data

US 2003/0141547 A1 Jul. 31, 2003

(30) Foreign Application Priority Data

Jan. 24, 2002 (JP) ........................................ 2002-015975

(51) Int. Cl.[7] .............................................. H01L 21/76
(52) U.S. Cl. ........................ 438/402; 438/407; 438/473
(58) Field of Search ................................ 438/402, 407, 438/473, 520, 582; 257/E21.564

(56) References Cited

U.S. PATENT DOCUMENTS 5,650,354 A * 7/1997 Himi et al. .................. 438/152
6,130,458 A * 10/2000 Takagi et al. ................ 257/351
6,441,679 B1 * 8/2002 Ohshima ...................... 327/538
6,524,928 B1 * 2/2003 Hirabayashi ................. 438/402

FOREIGN PATENT DOCUMENTS

JP 58-103124 6/1983
JP 2000-315736 11/2000

* cited by examiner

Primary Examiner—George Fourson
Assistant Examiner—Fernando L. Toledo
(74) Attorney, Agent, or Firm—McDermott Will & Emery LLP

(57) ABSTRACT

An SOI semiconductor device includes at least an SOI substrate including an insulating film and a semiconductor layer formed on the insulating film; and an active semiconductor element formed on the semiconductor layer. The active semiconductor element is formed in an element formation region surrounded by an isolating region for isolating the semiconductor layer in a form of an island. A gettering layer containing a high concentration impurity is formed in a portion of the semiconductor layer excluding the element formation region in which the active semiconductor element is formed, and the gettering layer is not formed in the element formation region in which the active semiconductor element is formed.

7 Claims, 14 Drawing Sheets

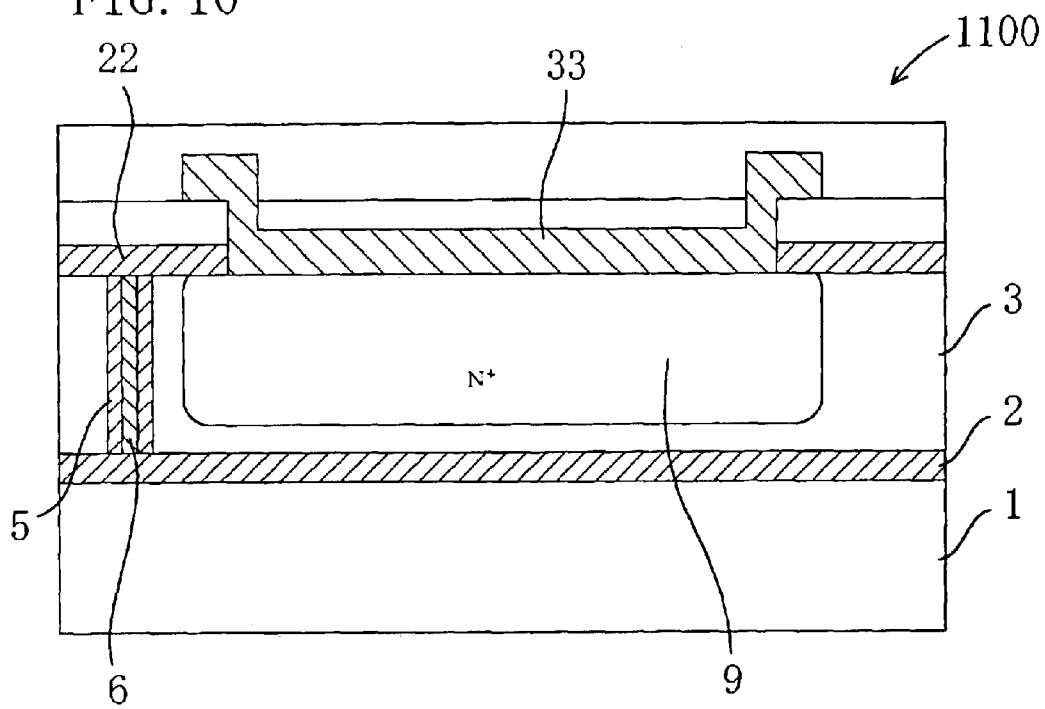
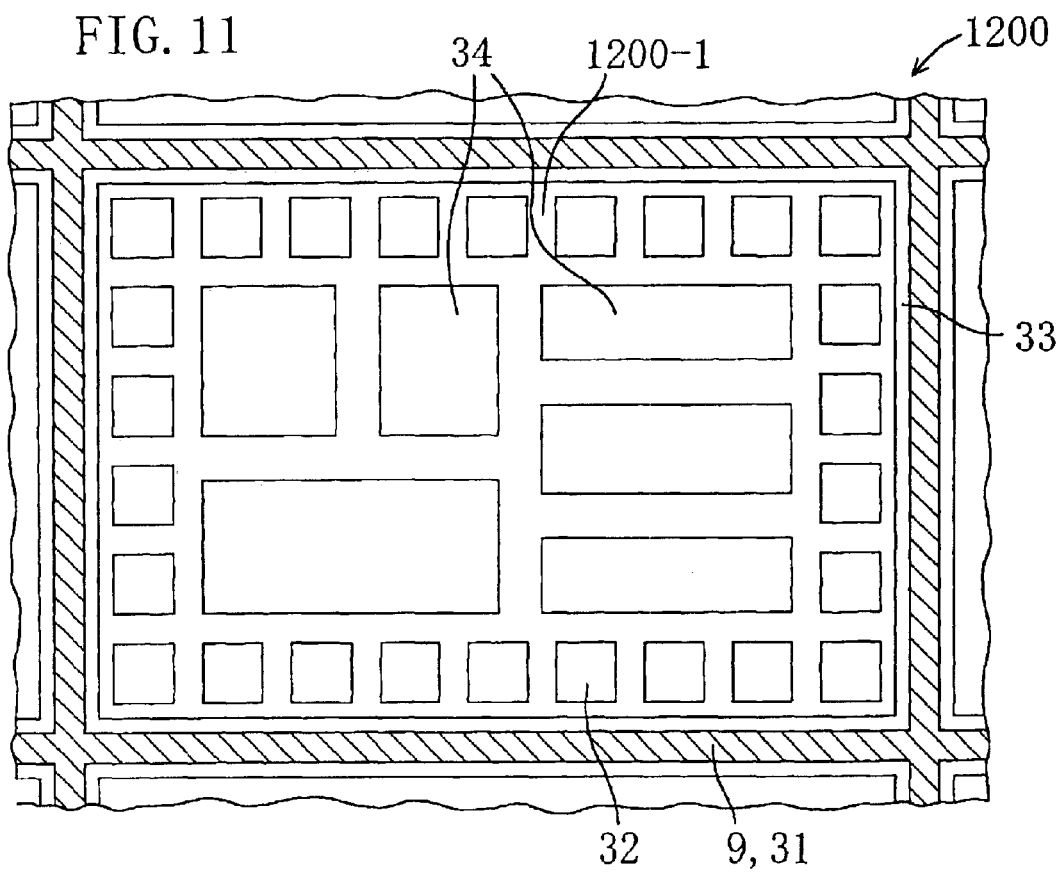

SOI SEMICONDUCTOR DEVICE HAVING GETTERING LAYER AND METHOD FOR PRODUCING THE SAME

BACKGROUND OF THE INVENTION

The present invention relates to an SOI semiconductor device employing an SOI substrate and a method for producing the same.

In production of semiconductor devices, high purity semiconductor substrates are used, but heavy metals slightly contained in a semiconductor substrate cause junction leakage in a semiconductor element, or a reduction in the withstand voltage of a gate oxide film. Therefore, the presence of heavy metals is not preferable.

With respect to such heavy metal contamination, in general, an approach called "gettering" is used to capture heavy metals to keep the heavy metals away from a semiconductor device, and thus the heavy metals are prevented from affecting the characteristics of a semiconductor device to be produced. A specific example of this approach is a brush damage method. In this method, a brush damage is caused on the back face of a semiconductor substrate to let this damaged layer capture heavy metals, so that the heavy metals are prevented from affecting the characteristics of a semiconductor element.

However, when producing an SOI semiconductor device employing an SOI substrate, this method cannot be used, because in SOI semiconductor devices, a semiconductor element is formed in an SOI active layer separated from a semiconductor substrate by a buried oxide film. That is to say, some heavy metals cannot pass through the buried oxide film, so that the damaged layer formed on the back face of the semiconductor substrate cannot prevent heavy metal contamination. Therefore, there is a demand for development of a gettering method for heavy metals suitable for SOI semiconductor devices.

A gettering method for an SOI semiconductor device that can solve this problem is disclosed, for example, in Japanese Laid-Open Patent Publication No. 2000-315736. A conventional SOI semiconductor device will be described with reference to FIG. 18.

FIG. 18A shows the planar structure of a CMOS transistor of a conventional SOI semiconductor device, and FIG. 18B shows the cross-sectional structure taken along line Y–Y' in FIG. 18A.

In the structures shown in FIGS. 18A and 18B, an n-type semiconductor layer 103 that will serve as an active layer of an SOI substrate is formed on a semiconductor substrate 101 that is a supporting substrate in an SOI substrate via a silicon oxide film 102 that is a first insulating film. The n$^-$-type semiconductor layer 103 is isolated in the form of an island by dielectrics, using the silicon oxide films 102 and 105. More specifically, an isolating groove 104 that reaches up to the buried silicon oxide film 102 is formed by etching, and then the silicon oxide film 105 serving as an insulating film is formed on the side wall portion of the isolating groove 104. Then, a polysilicon layer 106 is buried and thus the n$^-$-type semiconductor layer 103 is isolated in the form of an island by the silicon oxide film 102 and the silicon oxide film 105.

In the thus formed island-shaped n$^-$-type semiconductor layer 103, an n-type semiconductor layer 122 serving as an N well of a P channel MOS transistor, a p-type semiconductor layer 123 serving as a P well of an N channel MOS transistor, and a highly doped impurity diffusion region (p$^+$ layer) 110 for the gettering of heavy metals are formed. In other words, the highly doped impurity diffusion region (p+layer) 110 is formed in each of a plurality of n$^-$-type semiconductor layers 103 isolated in the form of an island. Furthermore, gate oxide films 125a and 125b, gate electrodes 124a and 124b, p$^+$-type semiconductor layers 126a and 126b for forming a drain region and a source region of a P channel MOS transistor, and n$^+$-type semiconductor layers 127a and 127b that will serve as a drain region and a source region of an N channel MOS transistor are formed. Further, wires are formed in this structure and thus a CMOS transistor is produced.

In this CMOS transistor, when the highly doped impurity diffusion region 110 is formed of boron, which is a p type impurity, and the concentration on the surface thereof is $1\times10^{18}$ atoms/cm$^3$ or more and $5\times10^{20}$ atoms/cm$^3$ or less, then the gettering of heavy metals is achieved by the highly doped impurity diffusion region 110, and thus junction leakage and reduction of the withstand voltage of gate oxide films can be prevented.

However, the inventors of the present invention found the following problem. In the above-described conventional SOI semiconductor device, crystal defects occur in the periphery of the captured heavy metals, so that it is necessary to space the highly doped impurity diffusion region 110 apart from the PN junction by a sufficient distance, which increases the size of a single semiconductor element, and consequently the size of a semiconductor chip is increased. That is to say, in the above-described SOI semiconductor device, the highly doped impurity diffusion region 110 is formed in the same island isolated by insulating films in which a semiconductor element is formed (or the highly doped impurity diffusion region 110 is formed very near an active region). Therefore, the size of the semiconductor element is increased. In the above publication, a method for forming the highly doped impurity diffusion region 110 straddling the isolating groove 104 that forms an isolated region is also proposed. However, in this case, since the highly doped impurity diffusion region 110 is spread in the horizontal direction at the time of diffusion, the gettering layer (the impurity diffusion region 110) is spread up to the inside of the semiconductor element. Therefore, as a result of ensuring the distance from the impurity diffusion region to the PN junction, a single semiconductor element becomes large, so that the entire semiconductor chip becomes large.

SUMMARY OF THE INVENTION

Therefore, with the foregoing in mind, it is a main object of the present invention to provide a compact SOI semiconductor device and a method for producing the same.

An SOI semiconductor device of the present invention includes at least an SOI substrate including an insulating film and a semiconductor layer formed on the insulating film; and an active semiconductor element formed on the semiconductor layer. The active semiconductor element is formed in an element formation region surrounded by an isolating region for isolating the semiconductor layer in a form of an island. A gettering layer containing a high concentration impurity is formed in a portion of the semiconductor layer excluding the element formation region in which the active semiconductor element is formed, and the gettering layer is not formed in the element formation region in which the active semiconductor element is formed.

It is preferable that the surface concentration of the high concentration impurity in the gettering layer is $1\times10^{18}$ atoms/cm$^3$ or more.

It is preferable that a plurality of active semiconductor elements are formed in the semiconductor layer, and all the active semiconductor elements are positioned within a distance of 1.5 mm from the gettering layer.

In one preferable embodiment, at least one of an N type well and a P type well is formed in the element formation region, and a depth of the gettering layer is substantially the same as or deeper than that of the well.

In one preferable embodiment, a plurality of active semiconductor elements are formed in one of the element formation regions, and the gettering layer is formed outside the isolating region surrounding the element formation region.

In one preferable embodiment, the gettering layer is provided apart from the isolating region.

In one preferable embodiment, the SOI substrate includes a silicon substrate, the insulating film formed on the silicon substrate, and an SOI active layer formed on the insulating film. The semiconductor layer is an SOI active layer made of silicon. The SOI active layer includes at least a transistor as the active semiconductor element. The gettering layer is not formed within a region in which the active semiconductor element is formed.

In one preferable embodiment, the SOI semiconductor device is a semiconductor chip. At least one power wire of a power wire on a low potential side and a power wire on a high potential side is provided in a peripheral region of the semiconductor chip. The gettering layer is formed in a semiconductor layer positioned directly below the power wire.

The gettering layer may be electrically connected to the power wire.

In one preferable embodiment, the SOI semiconductor device has a wafer structure including a plurality of semiconductor chip regions, each of which becomes a semiconductor chip when the plurality of semiconductor chip regions are cut. The SOI semiconductor device having the wafer structure includes a scribe lane that is a boundary portion of adjacent semiconductor chip regions and has the gettering layer in at least a portion of the semiconductor layer within the scribe lane.

In one preferable embodiment, the SOI semiconductor device is a semiconductor chip, a plurality of bonding pads are provided along a periphery of the semiconductor chip, and the gettering layer is provided directly below or a peripheral portion of at least one of the plurality of bonding pads.

The gettering layer can be provided directly below a region within 30 µm from an outer edge of the at least one bonding pad, the region including a region within said bonding pad.

In one preferable embodiment, the SOI semiconductor device has at least one of a bus wire, a power wire and a ground wire, and the gettering layer is provided below at least one of the bus wire, the power wire and the ground wire.

In one preferable embodiment, a passive semiconductor element is formed on the semiconductor layer via an insulating film. The gettering layer is formed in the semiconductor layer positioned below the passive semiconductor element. The passive semiconductor element is at least one of a capacitor and a polycrystalline silicon resistor.

In one preferable embodiment, the SOI semiconductor device includes a plurality of circuit blocks. Each of the plurality of circuit blocks has a length of one side of 3 mm or less. The gettering layer is provided in a periphery of each of the plurality of circuit blocks.

In one preferable embodiment, the SOI semiconductor device includes an output transistor. The output transistor is separated into a plurality of blocks such that the length of one side thereof is 3 mm or less. The gettering layer is provided in a periphery of each of the plurality of blocks.

In one preferable embodiment, the SOI semiconductor device includes a large-scale logic circuit. The large-scale logic circuit is divided into a plurality of blocks such that the length of one side thereof is 3 mm or less. The gettering layer is provided in a periphery of each of the plurality of blocks.

A first method for producing an SOI semiconductor device of the present invention includes the steps of preparing an SOI substrate including an insulating film and a semiconductor layer formed on the insulating film; forming a gettering layer containing a high concentration impurity selectively in a portion on a surface of the semiconductor layer excluding an element formation intended region in which an active semiconductor element is to be formed; performing a heat treatment for facilitating gettering of heavy metals contained in the semiconductor layer after the step of forming the gettering layer or in the same step; forming an isolating region in the semiconductor layer such that the element formation intended region is isolated in a form of an island after the heat treatment; and forming an active semiconductor element in the element formation intended region surrounded by the isolating region.

A second method for producing an SOI semiconductor device of the present invention includes the steps of preparing an SOI substrate including an SOI active layer made of a semiconductor; forming a gettering layer containing a high concentration impurity selectively in a portion on a surface of the SOI active layer excluding an element formation intended region in which an active semiconductor element is to be formed; introducing an impurity for forming a well in the element formation intended region on the surface of the SOI active layer after the gettering layer is formed; performing a heat treatment so as to drive the impurity in to form a well in the element formation intended region after the gettering layer is formed; and forming an isolating region in the semiconductor layer such that the element formation intended region is isolated in a form of an island after the heat treatment.

A third method for producing an SOI semiconductor device of the present invention includes the steps of preparing an SOI substrate including an SOI active layer made of a semiconductor; introducing a high concentration impurity so as to form a gettering layer selectively in a portion on a surface of the SOI active layer excluding an element formation intended region in which an active semiconductor element is to be formed; introducing an impurity for forming a well in the element formation intended region on the surface of the SOI active layer; performing a heat treatment so as to drive the impurity in to form a well in the element formation intended region and to facilitate gettering; and forming an isolating region in the semiconductor layer such that the element formation intended region is isolated in a form of an island after the heat treatment.

A fourth method for producing an SOI semiconductor device of the present invention includes the steps of preparing an SOI substrate including an insulating film and a semiconductor layer formed on the insulating film; forming a gettering layer containing a high concentration impurity in a portion on a surface of the semiconductor layer excluding an element formation intended region in which an active semiconductor element is to be formed; selectively introducing an impurity for forming a well in the element formation intended region and then performing a heat treatment so as to form a well; forming an isolating region surrounding the element formation intended region of the semiconductor layer such that the gettering layer is not included in the element formation intended region; and forming an active semiconductor element in the element formation intended region.

In one preferable embodiment, the step of forming the gettering layer includes the steps of forming an oxide film mask having an opening in a predetermined area on the semiconductor layer; introducing a high concentration impurity in the semiconductor layer through the opening of the oxide film mask; and etching the oxide film mask after the high concentration impurity is introduced. In the step of forming the gettering layer, a difference in level that is formed in the predetermined area of the semiconductor layer is used as a reference for aligning masks to be subsequently used.

In one preferable embodiment, the surface concentration of the high concentration impurity in the gettering layer is $1 \times 10^{18}$ atoms/cm$^3$ or more.

In one preferable embodiment, the prepared SOI semiconductor device is a wafer including a plurality of semiconductor chip regions, each of which becomes a semiconductor chip when the plurality of semiconductor chip regions are cut. Each of the semiconductor ship regions includes at least one region selected from the group consisting of a region in which a ground wire is provided, a region in which a bus wire is provided, a region in which a power wire is provided, a region in which a bonding pad is provided and a region in which a passive semiconductor element is provided, and a plurality of element formation intended regions. The gettering layer is formed in the semiconductor layer in the at least one region.

In one preferable embodiment, the prepared SOI semiconductor device is a wafer including a plurality of semiconductor chip regions, each of which becomes a semiconductor chip when the plurality of semiconductor chip regions are cut. A boundary portion of adjacent semiconductor chip regions is used as a scribe lane, and the gettering layer is formed in the semiconductor layer within the scribe lane.

In one preferable embodiment, the prepared SOI semiconductor device is a wafer including a plurality of semiconductor chip regions, each of which becomes a semiconductor chip when the plurality of semiconductor chip regions are cut. Each of the semiconductor chip regions includes a plurality of regions for forming circuit blocks. Each of the plurality of regions for forming circuit blocks has a length of one side of 3 mm or less. The gettering layer is formed in the semiconductor layer positioned around each of the plurality of regions for forming circuit blocks.

Another SOI semiconductor device of the present invention includes at least an SOI substrate including an insulating film and a semiconductor layer formed on the insulating film; and an active semiconductor element formed on the semiconductor layer. The active semiconductor element is formed in an element formation region surrounded by an isolating region for isolating the semiconductor layer in a form of an island. A gettering layer for capturing heavy metals in the semiconductor layer is formed in a portion of the semiconductor layer excluding the element formation region in which the active semiconductor element is formed, and the gettering layer is not formed in the element formation region in which the active semiconductor element is formed.

The gettering layer may be a damage layer having lattice defects that can capture the heavy metals in the semiconductor layer.

According to the present invention, the gettering layer is not formed in the element formation region in which an active semiconductor element is formed, so that a compact SOI semiconductor can be realized.

According to the present invention, the gettering layer is formed in a portion of the semiconductor layer excluding the element formation region in which an active semiconductor element is formed, and the gettering layer is not formed in the element formation region in which an active semiconductor element is formed. Therefore, a compact SOI semiconductor can be provided.

BRIEF DESCRIPTION OF THE DRAWINGS

FIG. 10 is a schematic view showing the cross-sectional structure taken along line A–A' in FIG. 9.

FIG. 11 is a schematic plan view showing a second structure of the SOI semiconductor device of Embodiment 2 of the present invention.

DETAILED DESCRIPTION OF THE INVENTION

Figure 1A:
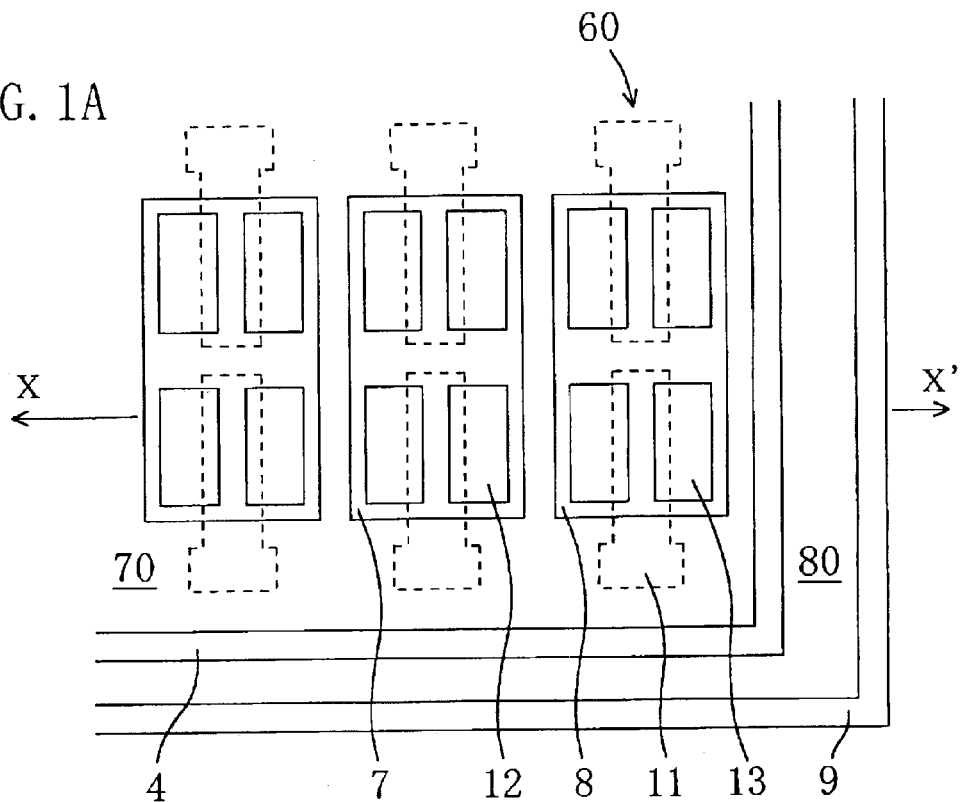
FIG. 1A is a schematic plan view showing a relevant portion of the structure of an active semiconductor element (CMOS transistor) contained in an SOI semiconductor device 1000 according to Embodiment 1 of the present invention.

Hereinafter, embodiments of the present invention will be described with reference to the accompanying drawings. In the following drawings, for simplification of description, elements having substantially the same function bear the same reference numeral. The present invention is not limited by the following embodiments.

Embodiment 1

Figure 1B:
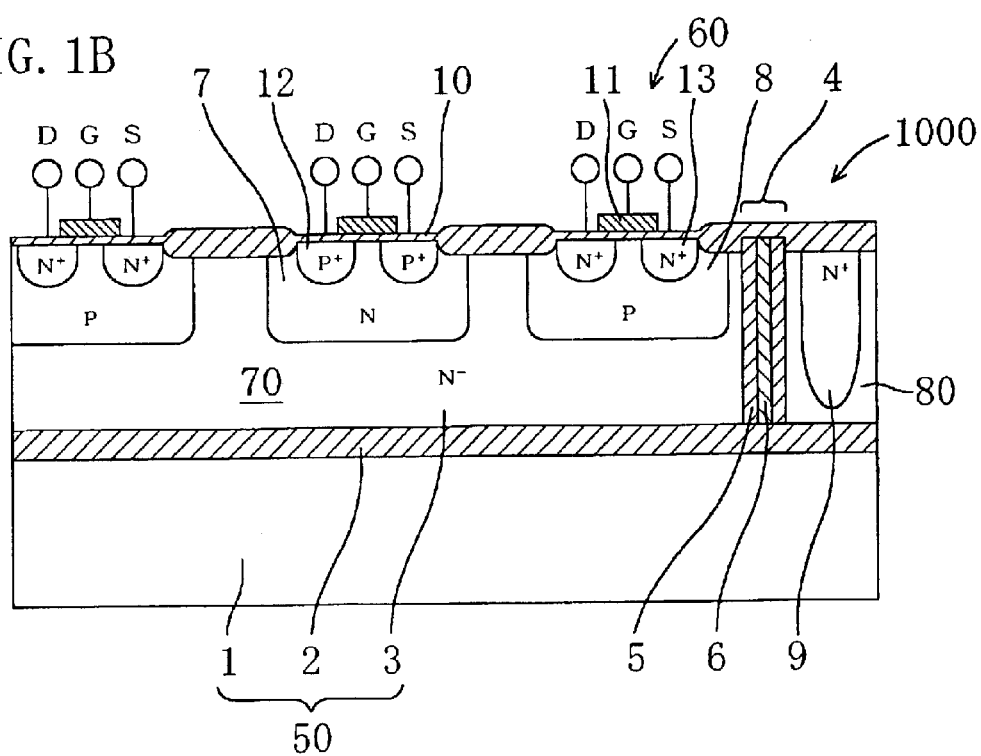
FIG. 1B is a cross-section view taken along line X–X' in FIG. 1A.

An SOI semiconductor device 1000 of Embodiment 1 of the present invention will be described with reference to FIGS. 1 and 2. FIG. 1A schematically shows a relevant portion of the structure of an active semiconductor element (CMOS transistor) contained in the SOI semiconductor device 1000 of this embodiment. FIG. 1B shows the cross-sectional structure taken along line X–X' in FIG. 1A.

The SOI semiconductor device 1000 of this embodiment includes an SOI substrate 50 including an insulating film 2 and a semiconductor layer 3 formed on the insulating film 2, and an active semiconductor element 60. The active semiconductor element 60 is formed in an element formation region 70 surrounded by an isolating region 4 for isolating the semiconductor layer 3 in the form of an island. A gettering layer 9 containing impurities in a high concentration is formed in a portion (80) of the semiconductor layer 3 outside the element formation region 70 in which the active semiconductor element 60 is formed. The gettering layer 9 is not formed in the element formation region 70 in which the active semiconductor element 60 is formed. With this structure, the isolating region 4 can provide a sufficient distance between the gettering layer 9 and the semiconductor device 60, and the area of the element formation region 70 can be made smaller than that of the conventional structure in which the gettering layer 9 is provided in the element formation region 70. Consequently, the entire SOI semiconductor device 1000 can be compact. When the semiconductor element is a bipolar transistor, element isolation is necessary for every single semiconductor element, so that the present invention can provide a significant advantage.

In this embodiment, a plurality of active semiconductor elements 60 are formed in the semiconductor layer 3, and all the active semiconductor elements 60 are positioned within a distance, for example, of 1.5 mm from the gettering layer 9. The reason why all the active semiconductor elements 60 are positioned within this distance will be described later. In the example shown in FIG. 1, the plurality of active semiconductor elements 60 are formed in one element formation region 70 positioned inside the isolating region 4, and the gettering layer 3 is formed outside the isolating region 4. In this example, an annular gettering layer 9 is formed outside of the isolating region 4 so as to surround the periphery of the isolating region 4 that defines the outer edge of the element formation region 70. The gettering layer 9 can be in contact with the isolating region 4 or be apart from it, as long as the gettering layer 9 is not positioned in the element formation region 70.

As shown in FIGS. 1A and 1B, at least one of n-type and p-type wells (7, 8) is formed in the element formation region 70, and the depth of the gettering layer 9 is larger than that of the wells (7, 8). The deeper the gettering layer 9 is, the more heavy metals can be captured in the production process, so that junction leakage and a reduction of the withstand voltage of the gate oxide films can be prevented more effectively. Consequently, a higher performance SOI semiconductor device can be realized. FIG. 1B schematically shows the outline of the gettering layer 9, but in reality, since impurities are diffused in the horizontal direction at a predetermined ratio, the area of the gettering layer 9 in the plane direction and the cross section becomes larger as the depth of the gettering layer 9 is larger. When forming an integrated circuit, a large number of element formation regions are formed, so that when the gettering layer 9 is formed in the element formation region, the influence of an increase of the area thereof is significant. However, in this embodiment, since the gettering layer 9 is formed in the region 80 that is outside the element formation region 70, the influence can be reduced significantly. Therefore, even if the area of the gettering layer 9 is large, this does not lead to an increase of the size of the SOI semiconductor device 1000 more than necessary. Depending on the production method, it is possible that the depth of the gettering layer 9 can be substantially the same as that of the wells (7, 8).

Figure 18A:
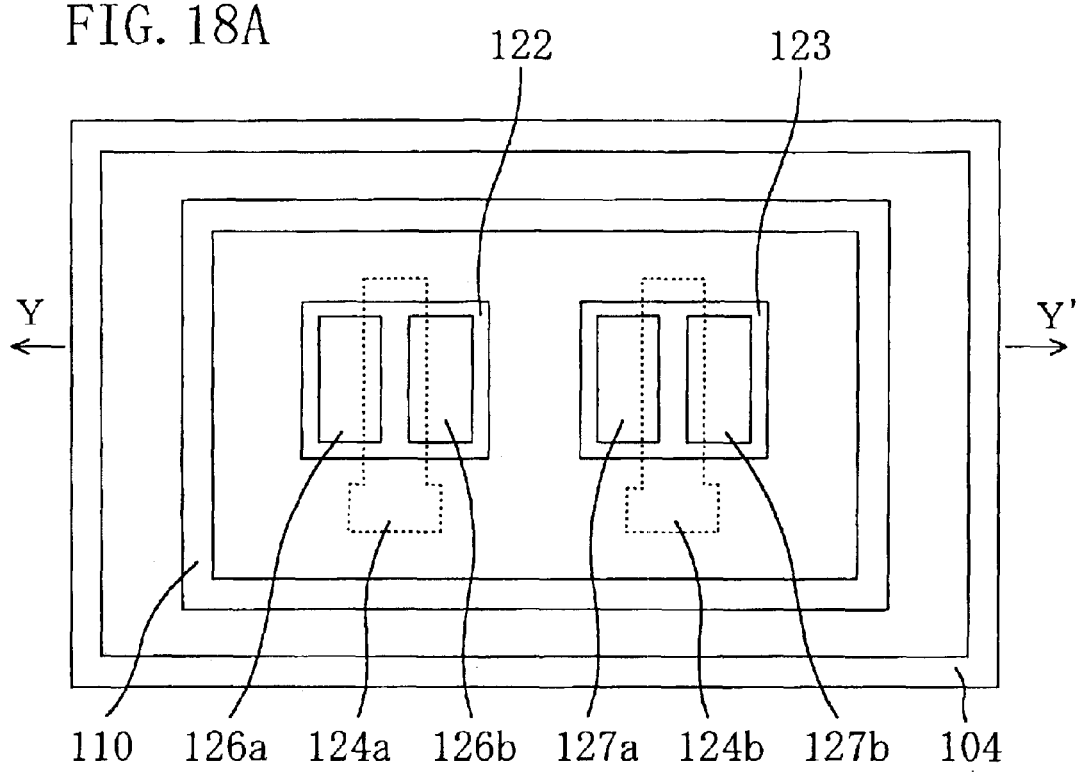
FIG. 18A is a plan view of a CMOS transistor of a conventional SOI semiconductor device.
Figure 18B:
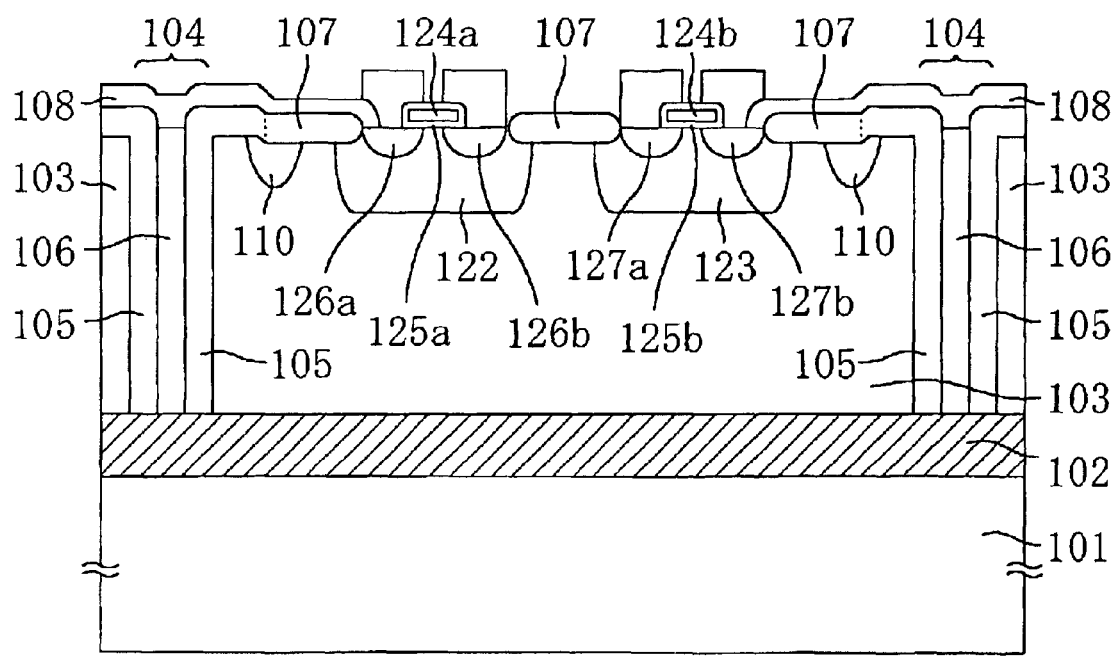
FIG. 18B is a cross-sectional view taken along line Y–Y' in FIG. 18A.

When the structure shown in FIG. 1 is made into the structure shown in FIG. 18, the gettering layer 9 is provided in every element formation region 70 in FIG. 1, but as in this embodiment, the structure where the gettering layer 9 is not provided inside the element formation region 70 can achieve sufficient gettering of heavy metals, and this structure can realize a compact SOI semiconductor device 1000 having a high gettering capability without increasing the area of the semiconductor chip. The structure of this embodiment having this effect has been achieved based on the following idea of the inventors of the present invention. The following explanation is directed to the fact that the gettering of heavy metals can be achieved without providing the gettering layer 9 inside the element formation region 70.

Heavy metals are moved in an SOI active layer 3 by a heat treatment during a semiconductor production process, which is the premise. Then, even if a gettering layer (9) is not provided in all the semiconductor elements (or element formation regions 70), the gettering of heavy metals can be achieved, as long as highly doped gettering layers (9) are provided in a region within the distance in which the heavy metals are moved by a heat treatment. In particular, if the gettering layer (9) is formed before forming an isolating groove for forming the isolating region 4, the gettering of heavy metals can be achieved, even if the gettering layers (9) are spaced apart by the distance in which the heavy metals are moved by a heat treatment during a semiconductor production process. Therefore, it is not necessary to provide the gettering layer (9) in all the semiconductor elements (or element formation regions 70), and the gettering of heavy metals can be achieved sufficiently, if the gettering layers (9) are locally formed.

Furthermore, the larger the amount of the heavy metals moved in the SOI active layer 3 by a heat treatment during a semiconductor production process is, the higher the heat the temperature of the heat treatment is and the longer the period of the heat treatment is. Therefore, if the getting layer is formed before the largest heat treatment in the semiconductor production process, a sufficient gettering effect can be obtained. The amount of the heavy metals moved in the SOI active layer by a heat treatment during a semiconductor production process is determined by the temperature and the period of the heat treatment, so that the gettering layers can be arranged efficiently by arranging them within the spacing distance that can provide the gettering effect under the heat treatment conditions during the semiconductor production process and by ensuring a sufficient spacing distance from the semiconductor element to the gettering layer.

The surface concentration of the highly doped impurities contained in the gettering layer 9 is for example, $1 \times 10^1$ atoms/cm$^3$ or more. The gettering layer 9 can perform the gettering function of heavy metals in this concentration range. Since the gettering layer 9 is not formed inside the element formation region 70, there is no limitation regarding the upper limit of the surface concentration. Typically, the upper limit is defined by the limit of solid solution in the semiconductor layer 3 (for example, about $5 \times 10^{20}$ atoms/cm$^3$). The impurities in the gettering layer 9 may be n-type impurities such as phosphorous or p-type impurities such as boron. The mechanism by which the gettering layer 9 performs gettering of heavy metals will be described with reference to FIG. 2.

Figure 2A:
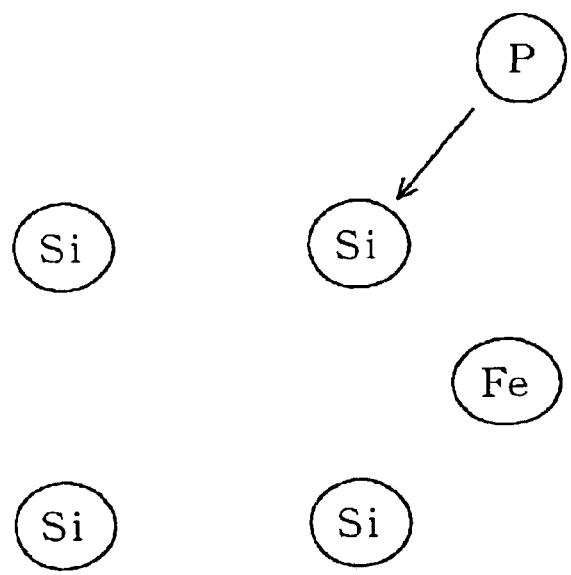
FIGS. 2A and 2B are diagrams for illustrating the mechanism of the gettering of heavy metals by the gettering layer 9.
Figure 2B:
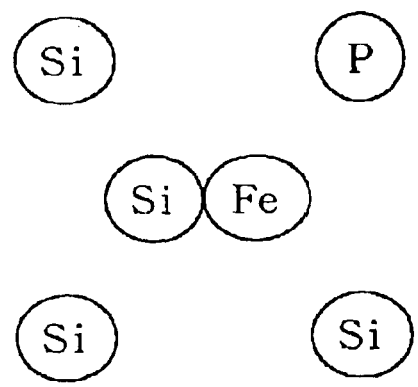

First, when impurities (phosphorous) are introduced in a high concentration and diffused in the semiconductor layer 3 that is made of silicon as shown in FIG. 2A, silicon (Si) that is in a crystal lattice is substituted with phosphorus (P) and the substituted silicon can capture a heavy metal (iron), as shown in FIG. 2B. That is to say, when phosphorus (P) is diffused in the silicon (Si) arranged in a lattice (FIG. 2A), the phosphorus (P) enters a lattice site location and redundant silicon (Si) captures iron (Fe) and is formed into silicide, and thus gettering of iron is achieved (FIG. 2B). With this mechanism, the heavy metals that pass through the gettering layer 9 are captured, so that the concentration of the heavy metals in the element formation region 70 before an element is formed can be reduced. The gettering of the heavy metals is performed effectively, in particular, with a high temperature heat treatment. However, for example, iron is 1.5 mm diffused by a drive-in process that is performed at a high temperature (1150° C.). Therefore, if the n$^+$-type highly doped gettering layer 9 is formed apart from the semiconductor element by a distance of not more than 1.5 mm, iron present within 1.5 mm is captured by the gettering layer 9, and thus substantially no iron is left in the semiconductor element 60. Thus, junction leakage and a reduction in the withstand voltage of gate oxide films can be prevented.

Further description of the structure of this embodiment in greater detail follows. The semiconductor layer 3 in the SOI substrate 50 is an SOI active layer made of silicon, and the SOI substrate 50 includes a semiconductor substrate 1 (for example, silicon substrate) serving as a supporting substrate, an insulating film (oxide silicon film) 2 formed on the semiconductor substrate 1, and an SOI active layer 3 formed on the insulating film 2. In the SOI active layer 3 (element formation region 70), a semiconductor integrated circuit including at least a transistor as an active semiconductor element 60 is formed. The gettering layer 9 is not formed in the region (70) in which the semiconductor integrated circuit is formed.

The transistor shown in FIG. 1 is a MOS transistor, but the present invention is not limited to this and can be other transistors (e.g., bipolar transistors). Furthermore, an element (e.g., thyristor) that is not a transistor can be provided as an active semiconductor element in the element formation region 70. It is of course possible to provide a passive semiconductor (e.g., a resistor or a capacitor) in the element formation region 70. Since a semiconductor integrated circuit is formed in the SOI active layer 3, there is no limitation regarding the kind of the substrate serving as the supporting substrate, and substrates other than a silicon substrate can be used, and the substrate 1 can be eliminated in some cases.

In the structure shown in FIG. 1, the n$^-$-type semiconductor layer 3 serving as an active layer is laminated on the semiconductor substrate 1 serving as the supporting substrate in the SOI substrate via the silicon oxide film 2 serving as a first insulating film. Then, the gettering layer 9, the n$^-$-type semiconductor layer 7 serving as an N well of a P channel MOS transistor, and the p-type semiconductor layer 8 serving as a P well of an N channel MOS transistor are formed on the n$^-$-type semiconductor layer 3 serving as the active layer in the SOI substrate 50. Furthermore, the isolating groove 4 is formed in order to isolate the n$^-$-type semiconductor layer 3 in the form of an island. The isolating groove 4 is formed by etching the n$^-$-type semiconductor layer 3 until the groove reaches the buried silicon oxide film 2. The silicon oxide film 5 serving as a second insulating film is formed on the side wall portion of the isolating groove 4 and the polysilicon layer 6 is buried in the isolating groove 4 covered with the silicon oxide film 5. Thus, the n$^-$-type semiconductor layer 3 is isolated in the form of an island by the buried silicon oxide film 2 and the silicon oxide film 5, which are dielectrics.

Furthermore, similarly to the structure of a known CMOS transistor, gate oxide films 10, gate electrodes 11, p$^+$-type semiconductor layers 12 for forming a drain region and a source region of a P channel MOS transistor, and n$^+$-type semiconductor layers 13 for forming a drain region and a source region of an N channel MOS transistor are formed. In an actual device, wires (not shown) are further formed in this structure. The illustrative conditions such as the thickness of each layer contained in the SOI semiconductor device of this embodiment will be described in the following description of a production method of this embodiment in order to avoid duplication.

Next, a method for producing the SOI semiconductor device 1000 of this embodiment will be descried with reference to FIGS. 3A through 6C. The FIGS. 3A through 6C are cross-sectional views for illustrating a process sequence of a method for producing the SOI semiconductor device 1000 of this embodiment.

Figure 3A:
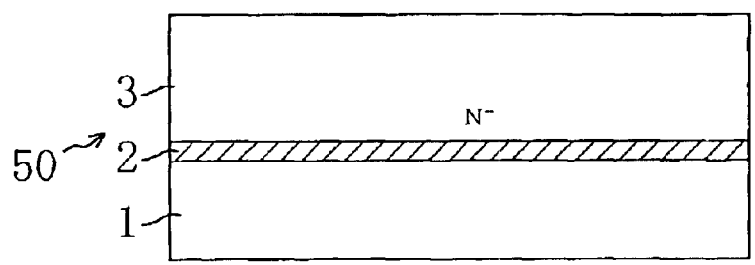
FIGS. 3A through 3D are cross-sectional views for illustrating a process sequence of a method for producing the SOI semiconductor device 1000 of Embodiment 1.

First, as shown in FIG. 3A, a SOI substrate 50 is prepared. The SOI substrate 50 can be formed in the following manner. First, an n$^-$-type semiconductor substrate is oxidized to form the oxide film 2 having a thickness of 0.5 to 3 μm, and then the semiconductor substrate 1 that will serve as the supporting substrate is attached to the surface on which the oxide film 2 is formed by heating. Thereafter, the n$^-$-type semiconductor substrate is polished so that the SOI substrate 50 including the n$^-$-type semiconductor layer 3 having a thickness of 0.5 to 30 μm that will serve as an SOI active layer can be obtained. The thicknesses of the buried oxide film 2 and the n$^-$-type semiconductor layer 3 can be selected as appropriate in accordance with the withstand voltage and the characteristics of the semiconductor element (60) to be formed.

Figure 3B:
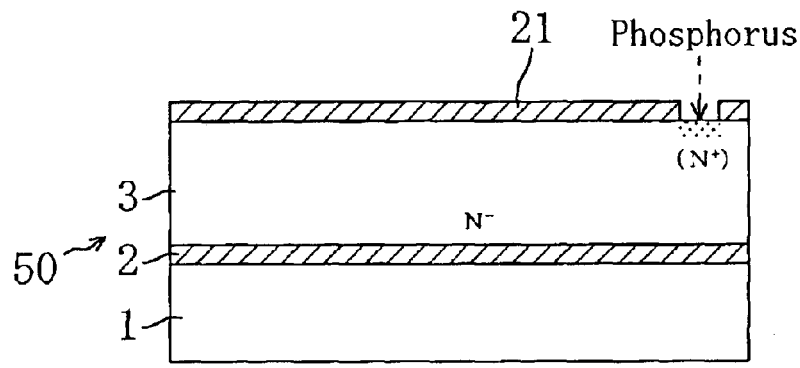

Next, as shown in FIG. 3B, the surface of the n$^-$-type semiconductor layer 3 is oxidized, and then the oxide film is etched with a resist mask covering a region in which an n$^+$-type gettering layer 9 is formed as a layer for gettering of heavy metals. Thus, an oxide film mask 21 for forming the n$^+$-type gettering layer 9 is formed. Then, phosphorus is implanted in an amount of $8 \times 10^{15}$ atoms/cm$^2$ and at an accelerated voltage of 100 kev in the opened region of the oxide film mask 21.

Figure 3C:
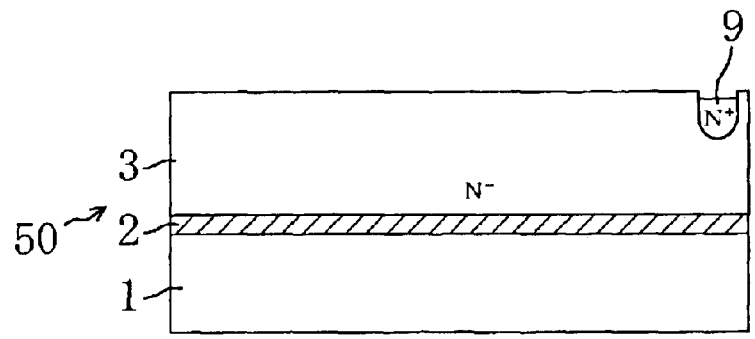

Thereafter, as shown in FIG. 3C, the n$^+$-type getting layer 9 is formed by performing a heat treatment in an atmosphere containing oxygen, and a silicon step is formed on the n⁻-type semiconductor layer 3. This silicon step can be used as the reference for mask alignment in the subsequent processes. In this case, the surface concentration of the n⁺-type gettering layer 9 is 1×10²⁰ (atoms/cm³). This surface concentration is an example, and the amount of ions to be implanted can be selected such that the surface concentration is, for example, 1×10¹⁸ (atoms/cm³) or more. Furthermore, as described above, the gettering layer 9 is not formed in a region in which a semiconductor element is to be formed, so that there is no limitation regarding the upper limit of the surface concentration, and the upper limit is defined by the limit of solid solution in the n⁻-type semiconductor layer 3.

In this embodiment, the gettering layer 9 is formed by ion implantation, but the gettering layer 9 can be formed by an impurity vapor deposition method. Phosphorus is used to form the gettering layer 9, but the gettering layer 9 can be formed of boron or arsenic.

In this embodiment, the n⁺-type gettering layer 9 is formed before the heat treatment for well formation of a CMOS transistor. This is because the temperature of the heat treatment for well formation is highest in the production process, so that the mobility of heavy metals is large during the heat treatment, and therefore the gettering effect of the gettering layer 9 can be large. However, it should be noted that it is necessary to form the gettering layer 9 before forming the isolating groove 4 because some heavy metals cannot pass through the oxide film 5 in a heat treatment after the side wall oxide film 5 of the isolating groove 4 is formed.

Figure 3D:
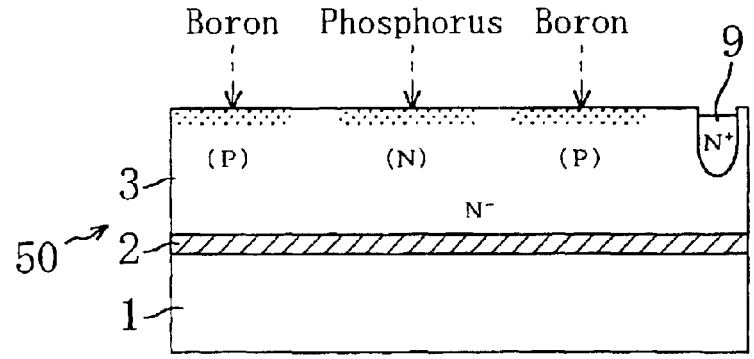

Next, as shown in FIG. 3D, ions are implanted for well formation. In this embodiment, first, ion implantation of phosphorus is performed with a resist mask formed over the n⁻-type semiconductor layer 3 to form an n-type semiconductor layer 7 as an N well of a P channel MOS transistor, and then the resist mask is removed. Thereafter, ion implantation of boron is performed with another resist mask so as to form a p-type semiconductor layer 8 as a P well of an N channel MOS transistor.

Figure 4A:
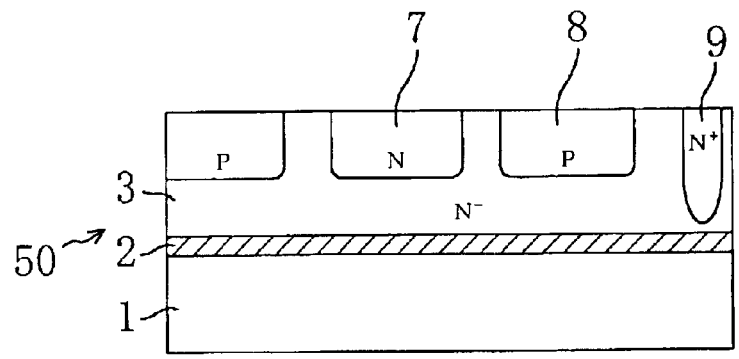
FIGS. 4A through 4D are cross-sectional views for illustrating a process sequence of a method for producing the SOI semiconductor device 1000 of Embodiment 1.

Next, as shown in FIG. 4A, after the resist mask is removed, a drive-in process is performed by a high temperature heat treatment, and then the wells of the n-type semiconductor layer 7 and the p-type semiconductor layer 8 are formed. This heat treatment is performed, for example, at 1150° C. in a nitrogen atmosphere for 100 minutes. During this heat treatment, the heavy metals are moved in the SOI active layer 3 and captured by the gettering layer 9 when they reach the gettering layer 9.

Figure 4B:
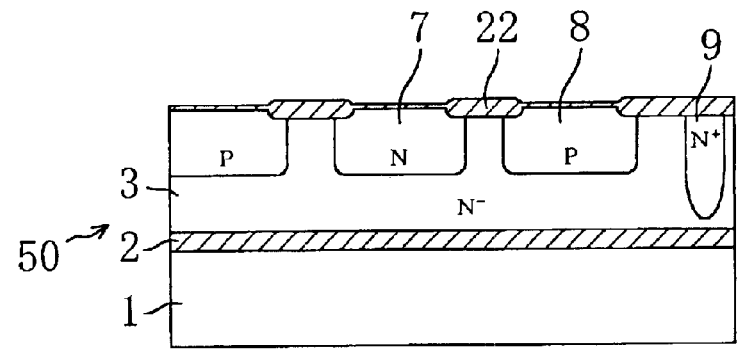

Next, as shown in FIG. 4B, in order to separate the P channel MOS transistor from the N channel MOS transistor, the following processes are performed. First, a silicon nitride film is formed on the n⁻-type semiconductor layer 3 in which the wells are formed, and then the silicon nitride film is locally etched with a resist mask. Then, the resist mask is removed, and thereafter a LOCOS oxide film 22 is formed by thermal oxidation. Thereafter, the silicon nitride film is removed.

Figure 4C:
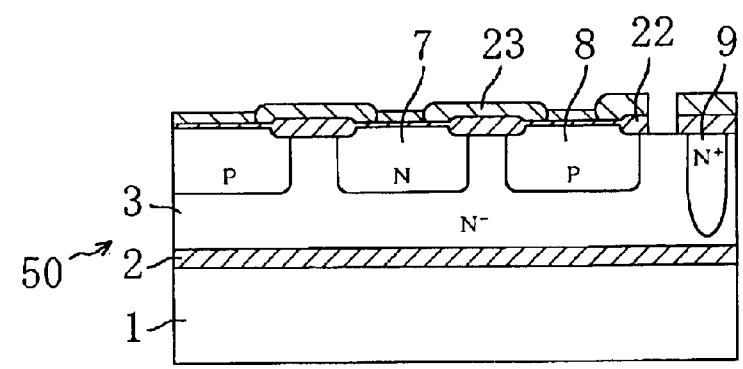
Figure 4D:
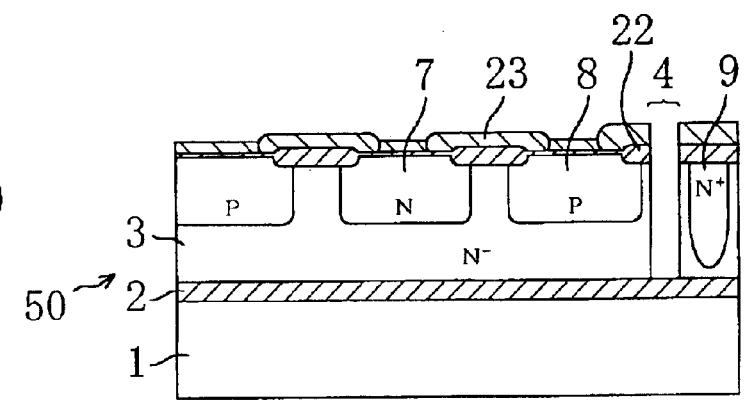

Next, as shown in FIG. 4C, a silicon nitride film 23 is formed again, and then the silicon nitride film 23 and the LOCOS oxide film 22 are locally etched with a resist mask. Thereafter, the resist mask is removed. Then, as shown in FIG. 4D, when the silicon layer (n-type semiconductor layer) 3 is etched, using the silicon nitride film 23 as a mask, the isolating groove 4 is formed.

Figure 5A:
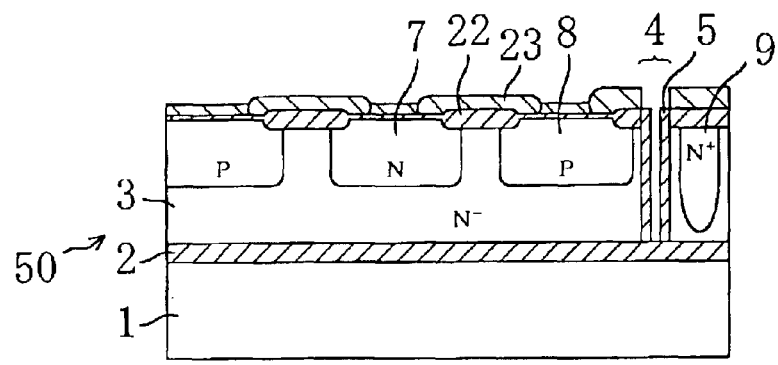
FIGS. 5A through 5D are cross-sectional views for illustrating a process sequence of a method for producing the SOI semiconductor device 1000 of Embodiment 1.
Figure 5B:
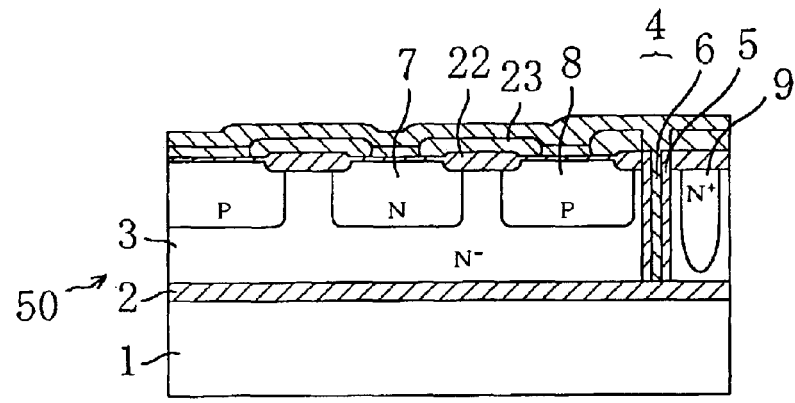

Next, as shown in FIG. 5A, in order to from an insulated island in the n⁻-type semiconductor layer 3, a side wall oxide film 5 having a thickness of 20 nm to 1 μm is formed on the side surface of the isolating groove 4 by thermal oxidation. Then, as shown in FIG. 5B, amorphous silicon is deposited by a CVD method to fill amorphous silicon in the isolating groove 4. The filled amorphous silicon is changed to a polysilicon layer 6 in the process of subsequent heat treatments.

Figure 5C:
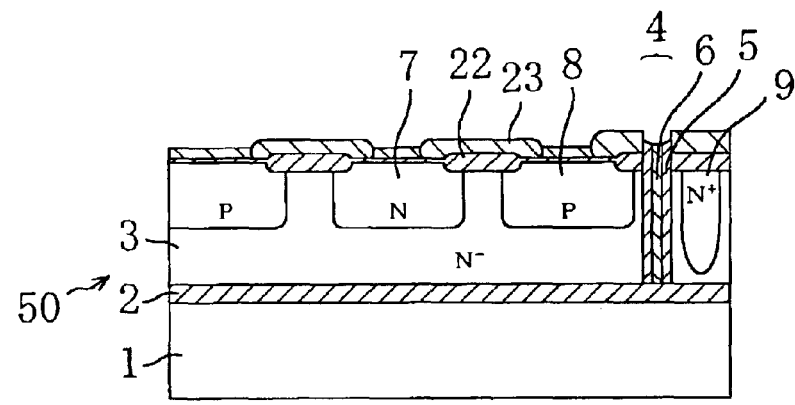
Figure 5D:
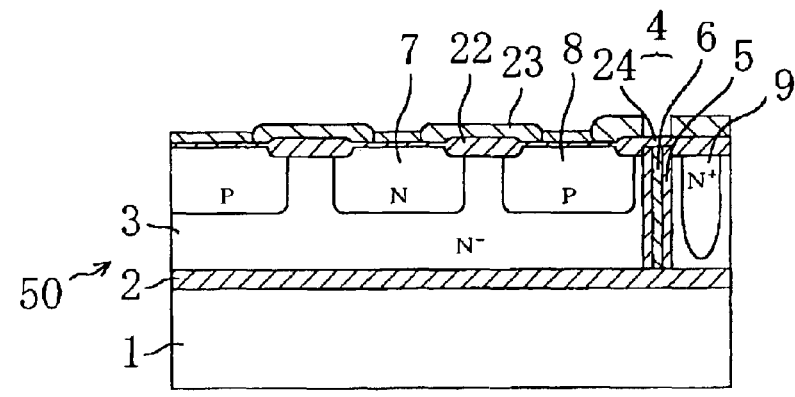

Next, as shown in FIG. 5C, the surface layer of the polysilicon layer 6 that is left on the surface is entirely etched, and then a surface oxide film 24 is formed to insulate the surface of the polysilicon in the isolating groove 4, as shown in FIG. 5D. Then, the nitride silicon 23 is removed. Thus, an isolating region (isolating groove) is formed.

In this embodiment, the isolating groove (isolating region) 4 is formed in a portion in which the LOCOS oxide film 22 is present, but the same gettering effect can be obtained, even if the isolating groove 4 is formed in other portions. A thermal oxide film is used as the insulating film 5 of the isolating groove side wall 4, but an oxide film formed by CVD can be used. Furthermore, polycrystalline silicon is used to fill the isolating groove, but an oxide film formed by CVD can be used.

Figure 6A:
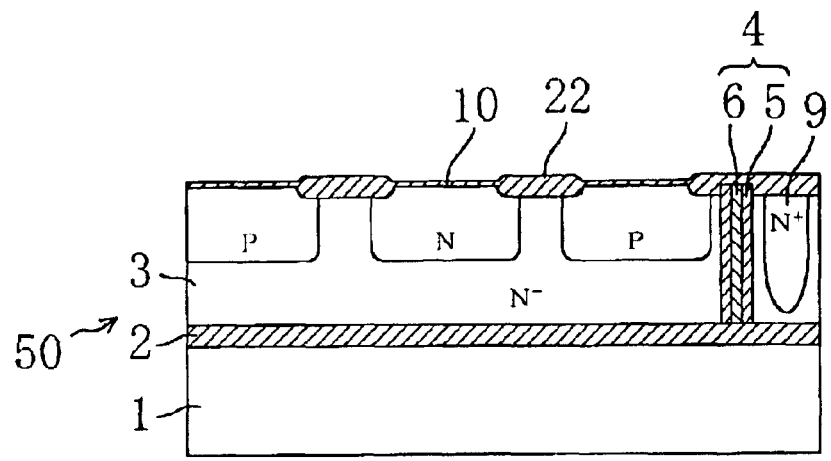
FIGS. 6A through 6C are cross-sectional views for illustrating a process sequence of a method for producing the SOI semiconductor device 1000 of Embodiment 1.

Next, as shown in FIG. 6A, the surface on which a P channel MOS transistor and an N channel MOS transistor are to be formed is oxidized so as to form a gate oxide film 10, and then silicon is deposited by CVD, followed by a heat treatment to form a polycrystalline silicon film. Then, the polycrystalline silicon film is etched with a resist mask (not shown) and thus the gate electrode 11 is formed.

Figure 6B:
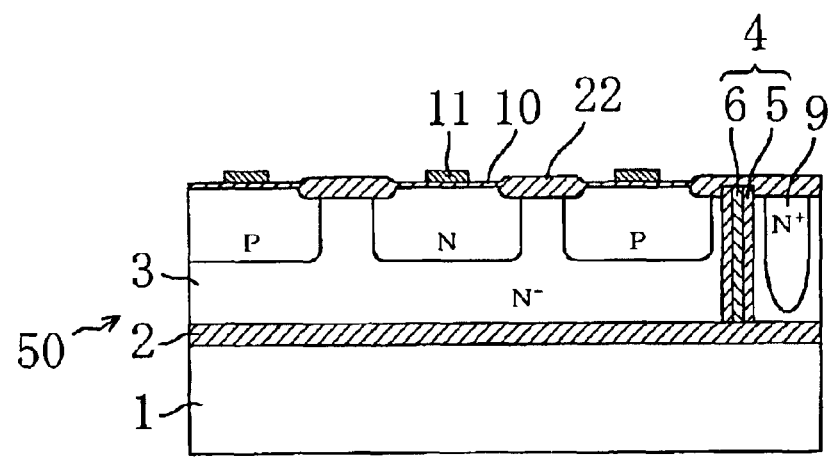
Figure 6C:
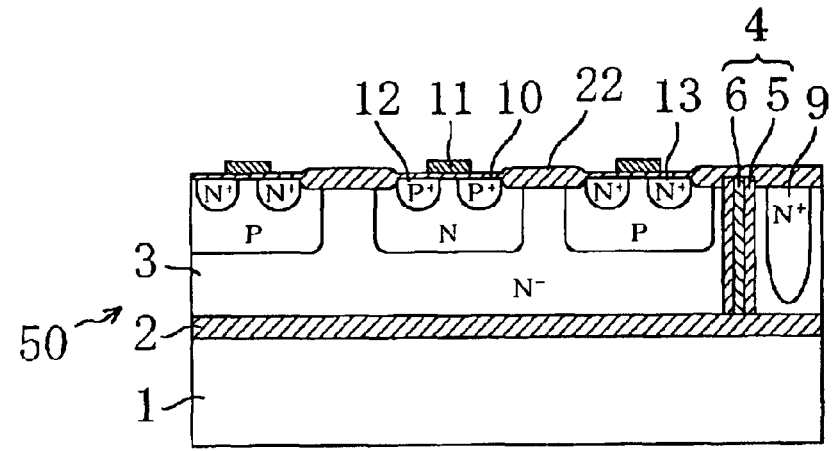

Furthermore, as shown in FIG. 6B, a p⁺-type semiconductor layer 12 for forming a drain and a source of a P channel MOS transistor is formed using a resist mask, the gate electrode 11 and the LOCOS oxide film 22 as masks in a P channel MOS transistor region by ion implantation. On the other hand, an n⁺-type semiconductor layer 13 for forming a drain and a source of an N channel MOS transistor is formed in an N channel MOS transistor region by ion implantation. Thereafter, when a heat treatment is performed, the state shown in FIG. 6C can be obtained.

Thereafter, wires are formed, and this P channel MOS transistors and N channel MOS transistors are formed. Thus, the SOI semiconductor device 1000 of this embodiment can be obtained.

According to the production method of this embodiment, the gettering layer 9 is formed selectively in a portion of the surface of the semiconductor layer 3 of the SOI substrate 50, and then a heat treatment for forming wells and also for gettering is performed before forming the isolating region 4 in the semiconductor layer 3. Then, an active semiconductor element (60) is formed in the element formation region (70) surrounded by the isolating region 4 so that junction leakage or a reduction in the withstand voltage of the gate oxide films can be prevented and a compact SOI semiconductor device 1000 can be produced.

Furthermore, since the gettering layer 9 is formed in the first diffusion process, the difference in level that is formed on the surface of the semiconductor layer 3 can be used as the reference mark for alignment of masks used in subsequent diffusion processes. Patterns for the reference mark and the gettering layer can be formed on the same mask dry plate, which eliminates the necessity of using a mask dry plate exclusively for the reference mark. Thus, this method can provide an advantage in that the production process can be simplified.

Next, another method for producing the SOI semiconductor device 1000 of this embodiment will be described with reference to FIGS. 7A through 8C. FIGS. 7A through 8C are cross-sectional views for illustrating a process sequence of another production method of this embodiment. This production method is characterized in that forming the gettering layer 9 and forming the wells (7, 8) are performed in the same process. This makes it possible to simplify the production process. The conditions for ion implantation or the like are substantially the same as in the above-described method.

Figure 7A:
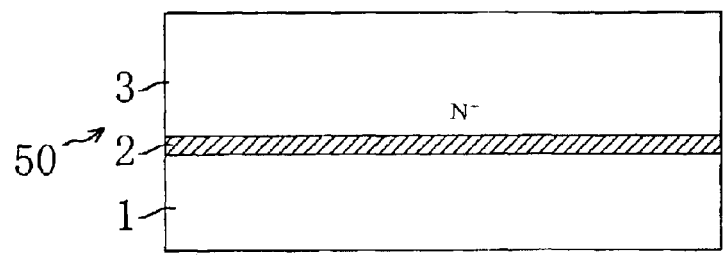
FIGS. 7A through 7D are cross-sectional views for illustrating a process sequence of a method for producing the SOI semiconductor device 1000 of Embodiment 1.

First, as shown in FIG. 7A, an SOI substrate 50 is prepared. The method for forming the SOI substrate 50 is the same as that described with reference to FIG. 3A.

Figure 7B:
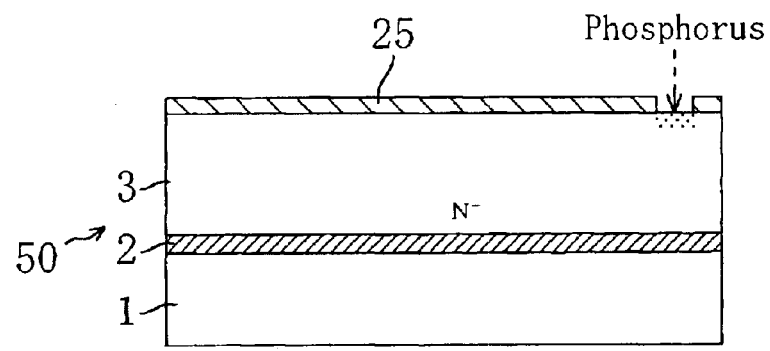
Figure 7C:
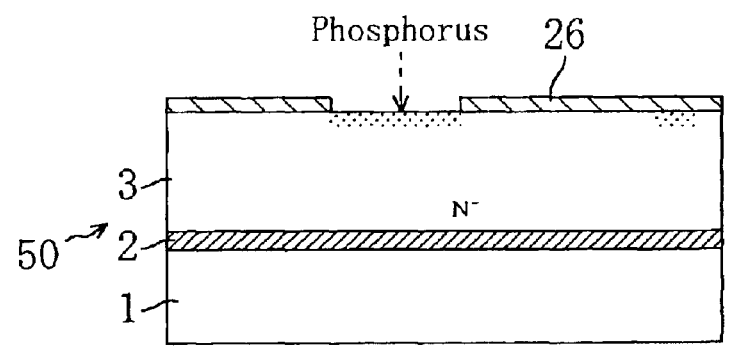
Figure 7D:
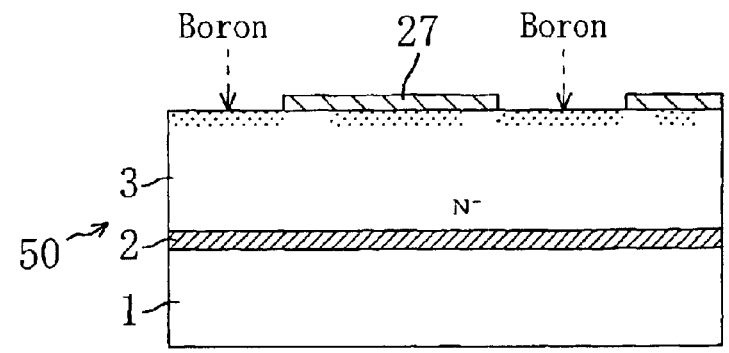

Then, as shown in FIG. 7B, ion implantation of phosphorus is performed in a region in which the $n^+$-type gettering layer 9 is to be formed as the layer for gettering of heavy metals, using a resist mask 25. Then, a shown in FIG. 7C, ion implantation of phosphorus is performed to form an n-type semiconductor layer 7 as an N well of a P channel MOS transistor, using a resist mask 26. Thereafter, a shown in FIG. 7D, ion implantation of boron is performed to form a p-type semiconductor layer 8 as a P well of an N channel MOS transistor, using a resist mask 27.

Figure 8A:
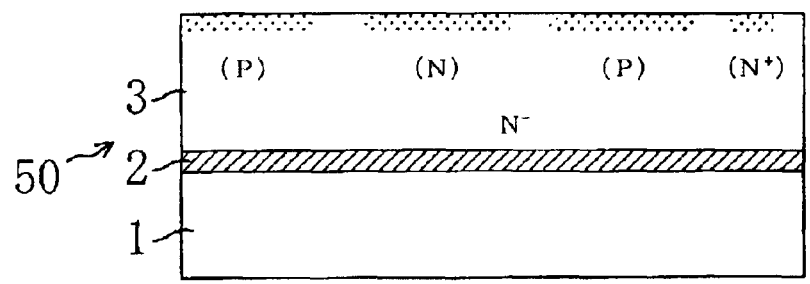
FIGS. 8A through 8C are cross-sectional views for illustrating a process sequence of a method for producing the SOI semiconductor device 1000 of Embodiment 1.
Figure 8B:
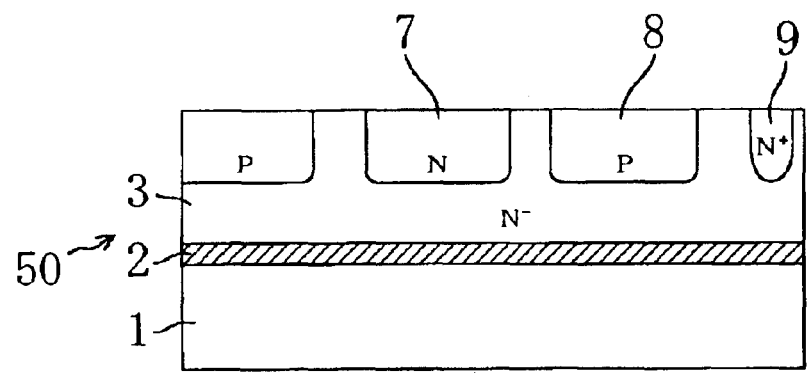

Next, as shown in FIG. 8A, after the resist mask is removed, a drive-in heat treatment is performed collectively, then the $n^+$-type gettering layer 9, the n-type semiconductor layer 7 and the p-type semiconductor layer 8 are formed at the same time, as shown in FIG. 8B. This heat treatment is performed, for example, at 1150° C. in a nitrogen atmosphere for 100 minutes. During this heat treatment, the heavy metals are moved in the SOI active layer 3 and captured by the gettering layer 9 having a gettering function when they reach the gettering layer 9.

Figure 8C:
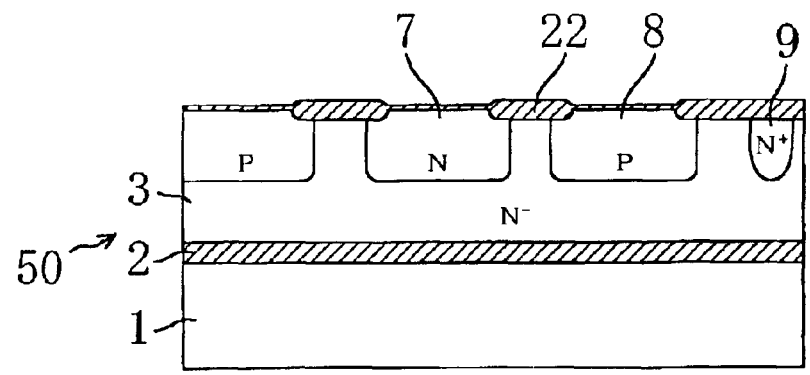

Next, as shown in FIG. 8C, in order to separate the P channel MOS transistor from the N channel MOS transistor, a LOCOS oxide film 22 is formed. The LOCOS oxide film 22 is formed in the same manner as the method described above with reference to FIG. 4B. That is, after silicon nitride is formed, and then the silicon nitride is locally etched with a resist mask. After the resist mask is removed, the LOCOS oxide film 22 is formed by thermal oxidation. Thereafter, the silicon nitride is removed. The subsequent processes are the same as in the above-described production method and are not described further.

According to this production method, the gettering layer and the well layers (7, 8) can be formed at the same time, and thus the process can be simplified. In the production method above, the gettering layer 9 is formed prior to the well layers (7, 8), whereas in this production method, the gettering layer and the well layers (7, 8) can be formed at the same time, so that the depth of these layers can be substantially in the same level.

In this method, after ion implantation for forming the gettering layer 9 and the well layers (7, 8) is all completed, a heat treatment is performed for these layers at the same time. Therefore, the ion implantation of these layers can be performed in any order.

Embodiment 2

An SOI semiconductor device of Embodiment 2 according to the present invention will be described with reference to FIGS. 9A and 17.

Unlike the structure shown in FIG. 18, in the SOI semiconductor device of this embodiment, it is not necessary to provide the gettering layer 9 for each element formation region 70, so that the degree of freedom in designing is increased significantly. That is to say, in order to obtain the gettering effect, it is sufficient to meet the condition that all the active semiconductor elements 60 are arranged within a predetermined distance (e.g., within 1.5 mm) from the gettering layer 9, and thus the degree of freedom in designing is increased. In addition, it is possible to provide the gettering layer 9 in a portion that constitutes a dead space when forming the SOI semiconductor device, for example, in the $n^-$-type semiconductor layer corresponding to a layer below a region in which other components are positioned. Furthermore, a region in which a power line (power wire and/or ground wire) requires a relatively large area in many cases, so that dead spaces (unused spaces) tend to be formed around the power line. Therefore, the gettering layer 9 can be provided in these dead spaces. Furthermore, in the region in which resistor elements are arranged, a portion where the resistor elements are not formed is a dead space (unused space), and the gettering layer 9 can be provided there.

In the case where the gettering layer 9 can be formed in such an unused space, the spread of the area occupied only by the gettering layer 9 can be prevented by utilizing the dead spaces efficiently, and further compactness can be achieved. In other words, only the fact that it is not necessary to provide at least one gettering layer 9 in each element formation region 70 can reduce the area of a chip, and in addition to that, the area of a chip can be reduced further by providing the gettering layer 9 in a portion overlapping a region in which other components are positioned. That is to say, the present invention further can provide an advantage in view of the layout of a semiconductor chip. Hereinafter, the SOI semiconductor device of Embodiment 2 of the present invention will be described in detail.

First Structure

Figure 9A:
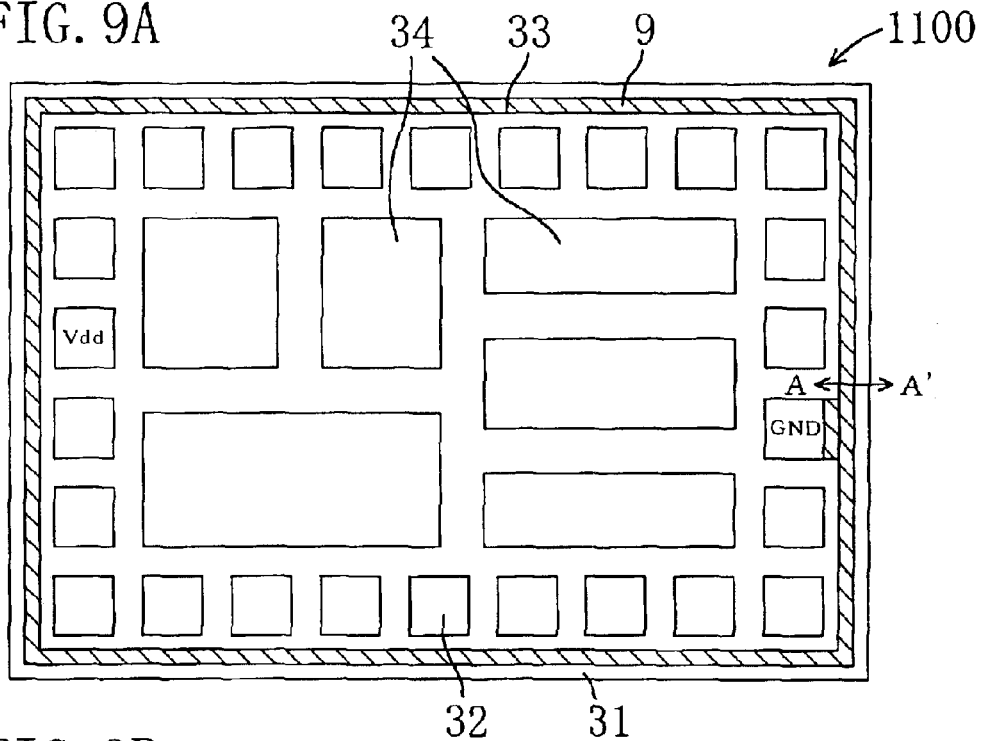
FIGS. 9A and 9B are schematic plan views showing a first structure of an SOI semiconductor device of Embodiment 2 of the present invention.

FIG. 9A is a schematic plan view showing a first structure of the SOI semiconductor device of this embodiment. FIG. 10 is a schematic view showing the cross-sectional structure taken along line A–A' in FIG. 9A.

The SOI semiconductor device 1100 shown in FIGS. 9A and 10 have the structure of a semiconductor chip. A ground wire 33, which is the power wire on the low potential side, is provided in a peripheral region of the SOI semiconductor device 1100, which is a semiconductor chip. The gettering layer 9 is provided below the ground wire 33. In this SOI semiconductor device 1100, the ground wire 33 (left hatched portion in FIG. 9A) is provided in the periphery of the chip in order to stabilize the ground potential in the chip. The gettering layer 9 is provided below the ground wire 33. FIG. 9 also shows a scribe lane (or a part of a scribe lane) 31 that is positioned in the periphery of each semiconductor chip region in a state of a semiconductor wafer and serves as a margin for cutting. In this embodiment, the scribe lane 31 is positioned in a circumference outer than the ground wire 33.

As shown in FIG. 9A, a plurality of bonding pads 32 are provided along the inner circumference of the ground wire 33, and a circuit block 34 is positioned inside the bonding pads. The circuit block 34 is constituted by a circuit network including a plurality of semiconductor elements such as CMOS transistors 60 as shown in FIG. 1.

Even if the gettering layer 9 is provided below the ground wire 33 in the periphery of a chip, the gettering layer 9 can be arranged within a distance in which heavy metals are diffused by a heat treatment, provided that the semiconductor chip is small. Therefore, sufficient gettering of the heavy metals can be achieved by the gettering layer 9. In addition, since the gettering layer is formed below the ground wire 33, it is possible to realize the SOI semiconductor device 1100 in which junction leakage and a reduction in the withstand voltage of gate oxide films can be prevented in the same chip area as in the case where the gettering layer 9 is not provided. In the above-described structure, an example in which the ground wire 33, which is the power wire on the low potential side, is provided in the periphery of a chip has been described, but the ground wire 33 can be replaced by a power wire on the high potential side (Vcc wire), and the gettering layer 9 can be provided therebelow.

As shown in FIG. 10, the gettering layer 9 can be connected electrically to the ground wire 33. In other words, a contact can be provided in the gettering layer 9 formed below the ground wire 33. This can provide an advantage that the gettering layer 9 stabilizes the ground potential of the chip. The effect of this embodiment can be obtained only by providing the gettering layer 9 below the ground wire 33 without allowing the two components to be in contact with each other.

Figure 9B:
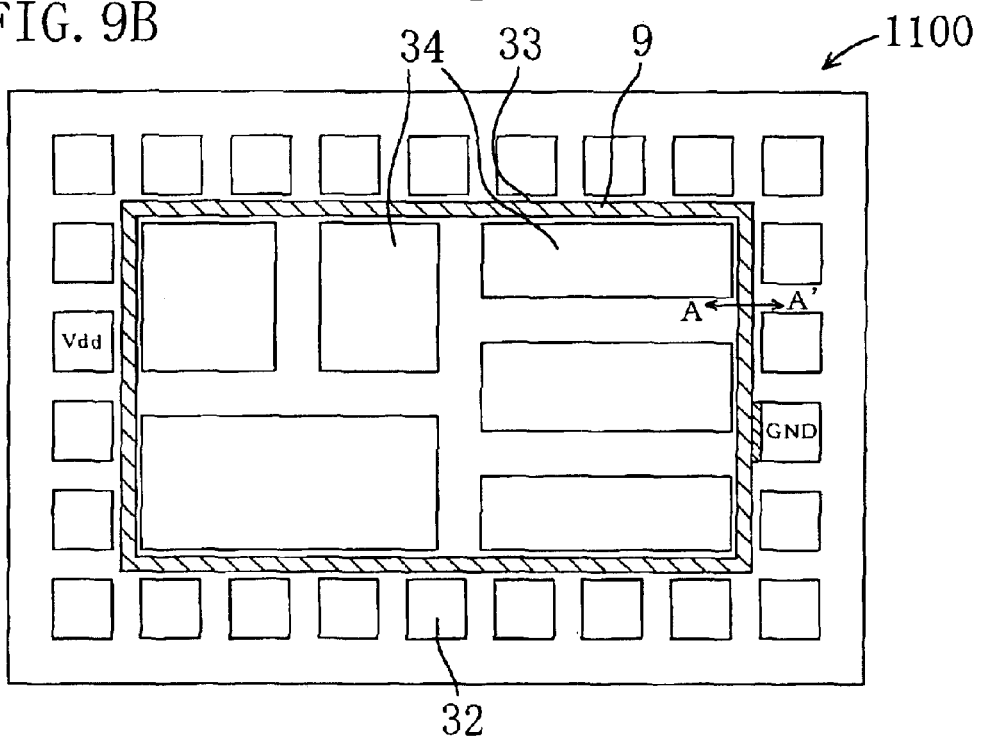

The ground wire 33 can be arranged inside a plurality of bonding pads 32 arranged in the peripheral region of the semiconductor chip (e.g., an unused space between the bonding pads 32 and the circuit blocks 34), as shown in FIG. 9B. In this case, the gettering layer 9 can be arranged below the ground wire 33. Furthermore, even if the ground wire 33 can be arranged outside the bonding pads 32 as shown in FIG. 9A, the gettering layer 9 can be arranged inside the plurality of bonding pads 32 arranged in the peripheral region (e.g., an unused space between the bonding pads 32 and the circuit blocks 34). In the case where the gettering layer 9 is arranged inside the bonding pads 32, the gettering layer 9 becomes closer to the circuit blocks 34, so that in view of diffusion of heavy metals due to heating, the heavy metals in a region in which the circuit blocks 34 are present can be removed more efficiently.

Figure 9C:
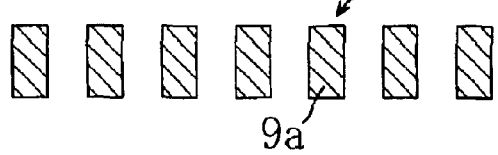
FIG. 9C is a schematic plan view showing the structure of the gettering layers that are formed discretely.

The gettering layer 9 can be formed continuously as shown in FIGS. 9A and 9B or can be formed discretely as shown in FIG. 9C. In FIG. 9C, strip regions 9a are arranged to form the gettering layer 9 in the level shown in FIGS. 9A and 9B. Forming the gettering layer 9 including small regions (9a) makes designing and editing easy when the gettering layer 9 is arranged in a dead space. The small regions (9a) having the same shape can be arranged at an equal interval, or those having arbitrary shapes can be arranged at an arbitrary interval. The structure in which the gettering layer is formed discretely can be used in the embodiments described later.

Second Structure

FIG. 11 is a schematic plan view showing a second structure of the SOI semiconductor device according to this embodiment. In the first structure, the gettering layer 9 is provided below a power wire on the low potential side (ground wire) 33, whereas in this structure, the gettering layer 9 is provided in a scribe lane region (a portion denoted by reference numeral 31 in FIG. 9A). This structure will be further described below.

An SOI semiconductor device 1200 shown in FIG. 11 has the structure of a wafer and is constituted by a wafer 1200 including a plurality of semiconductor chip regions 1200-1 that becomes a semiconductor chip when the water is cut along the scribe lane region 31.

The scribe lane region 31 is positioned outside the power wire on the low potential side 33 provided in the periphery of the semiconductor chip regions 1200-1 and is positioned in a boundary portion of adjacent semiconductor chip regions 1200-1, and this is a margin for cutting that is cut with a diamond cutter or the like (not shown) after all diffusion is completed in the state of the wafer 1200. The majority of the scribe lane region 31 is fallen off when being cut with a diamond cutter, and only a portion remains in the semiconductor chip state. Therefore, the semiconductor elements or wires that are used in circuitry are not formed and constitute a kind of dead space in the state of the wafer 1200. The width of the scribe lane region 31 is about 30 $\mu$m for one semiconductor chip region 1200-1 and about 60 $\mu$m for adjacent semiconductor chips.

In the SOI semiconductor device shown in FIG. 11, the gettering layer 9 is provided in a semiconductor layer positioned in the scribe lane region 31 in the wafer 1200. The gettering layer 9 is most preferably provided in the entire scribed lane region 31, but the gettering layer 9 can be partially missing in the scribe lane region 31.

Also when the gettering layer 9 is formed in the scribe lane region 31, gettering of heavy metals can be achieved as well as in the first structure, and thus a compact SOI semiconductor device in which junction leakage and a reduction in the withstand voltage of gate oxide films can be prevented can be realized. In the scribe lane 31, which is a margin for cutting, no semiconductor elements for constituting circuitry is formed, so that the chip area is not increased by forming the gettering layer 9. The gettering layer 9 is not necessary after a device is completed, so that there is no problem when it is eliminated at the time of cutting a wafer into chips.

Even if the gettering layer 9 is partially missing in the scribe lane region 31, substantially the same effect can be obtained, provided that it is formed in most part of the scribe lane region 31. Therefore, in a missing portion of the gettering layer 9 in the scribe lane region 31, a semiconductor element (not shown) for process monitoring, alignment marks (not shown) for aligning masks or other components can be provided. With this structure, the electrical characteristics of a semiconductor element for process monitoring are measured in the state of the wafer 1200 to identify the electrical characteristics of the semiconductor elements used in a circuitry indirectly. The alignment mask is unnecessary when all the diffusion processes are finished, so that there is no problem when it is provided in the scribe lane region 31. When the alignment mark is provided in the scribe lane region 31, the size of the semiconductor chip region can be smaller than in the case where it is provided in other portions than the scribe lane region 31.

Third Structure

Figure 12:
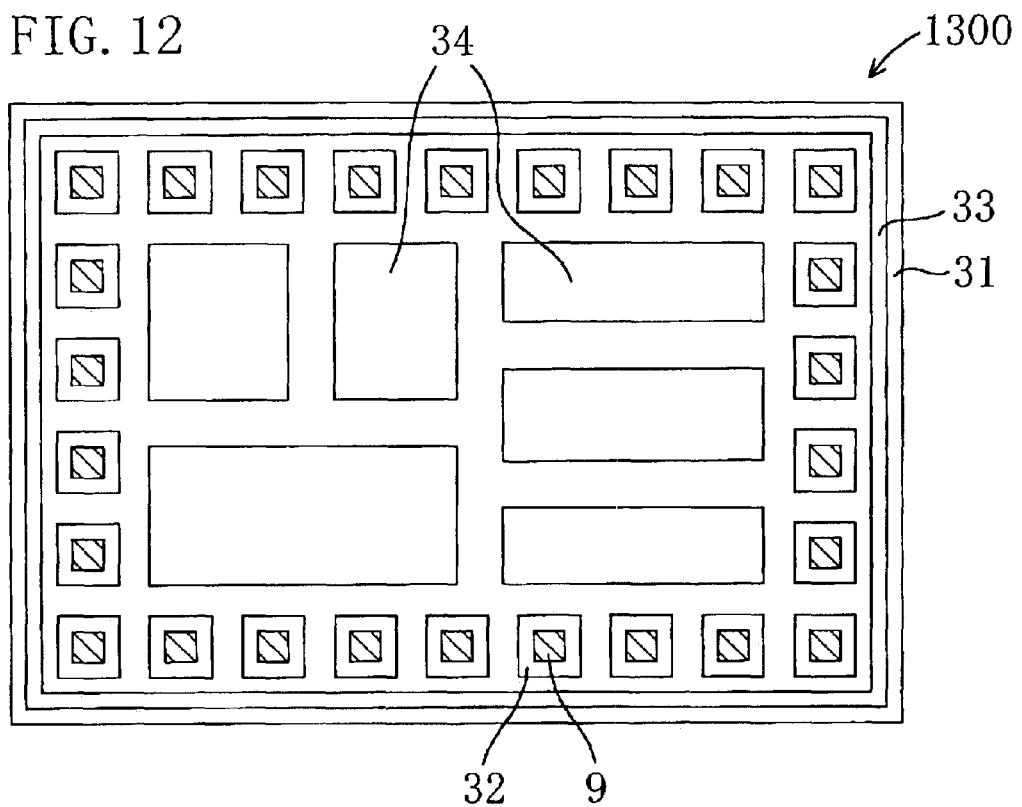
FIG. 12 is a schematic plan view showing a third structure of the SOI semiconductor device of Embodiment 2 of the present invention.

FIG. 12 is a schematic plan view showing a third structure of the SOI semiconductor device of this embodiment. In this structure, the gettering layer 9 is provided below the bonding pads 32, which is different from the above-described structure.

Further describing this structure, an SOI semiconductor device 1300 shown in FIG. 12 has the structure of a semiconductor chip, and in the semiconductor chip 1300, a plurality of bonding pads 32 are arranged along the periphery thereof.

The bonding pads 32 are formed of a metal used in internal wiring and are formed on an insulating film formed on the SOI active layer of the SOI substrate. Inputs or outputs of circuits that are integrated in the semiconductor chip 1300 are connected to the bonding pads 32 by wiring (not shown). In the wire bonding process, which is a post-process, a gold wire is bonded for connection to a lead frame (not shown). In this wire bonding process, thermocompression bonding or ultrasonic compression bonding is used, and a stress is applied to a semiconductor layer directly below the bonding pads 32. This stress may lead to leak malfunction, so that in general, in the semiconductor layer directly below the bonding pads 32, no semiconductor element is formed, and therefore the semiconductor layer directly below the bonding pads 32 constitutes a dead space. Not only the semiconductor directly below the bonding pads 32, but also the periphery thereof is a dead space. This portion is also a dead space, because of the matter of the precision of the machine in the wire bonding process. More specifically, even if bonding is performed aiming at the center of the pad 32, the position of the boning may be displaced from the pad 32. In view of this displacement, the periphery of the pad 32 (e.g., within 30 $\mu$m from the outer edge of the pad) is made into a dead space.

In this embodiment, the gettering layer 9 is provided in the semiconductor layer directly below or the periphery of the plurality of bonding pads 32 that are arranged along the periphery of the semiconductor chip 1300. With this structure, the gettering layer 9 provided in a portion directly below or the periphery of the plurality of bonding pads 32, which is a dead space in the first place, does not increase the chip area, and the gettering effect can be obtained as well as in the first structure, and a compact SOI semiconductor device in which junction leakage and a reduction of the withstand voltage of the gate oxide films are prevented can be realized.

Fourth Structure

Figure 13:
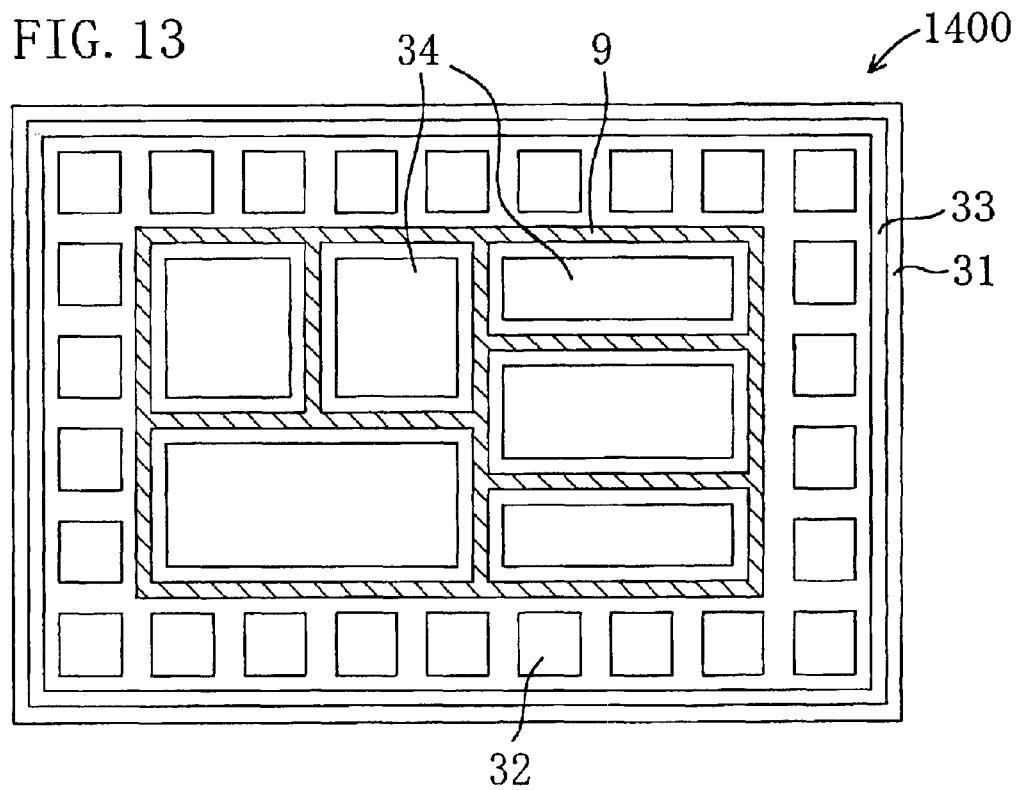
FIG. 13 is a schematic plan view showing a fourth structure of the SOI semiconductor device of Embodiment 2 of the present invention.

FIG. 13 is a schematic plan view showing a fourth structure of the SOI semiconductor device of this embodiment. In this embodiment, the gettering layer 9 is provided in the periphery of each circuit block, which is different from the above-described embodiments.

Further describing this structure, an SOI semiconductor device 1400 shown in FIG. 13 includes a plurality of circuit blocks 34, and each circuit block 34 is designed such that the length of one side is 3 mm or less. With this design, when the gettering layer 9 is formed in the periphery of each circuit block 34, the gettering layer 9 can be provided in a region within 1.5 mm from all the semiconductor elements. Therefore, even if a large chip is used, effective gettering of heavy metals in the semiconductor element formation region can be achieved. In addition, compared to the structure in which the gettering layer is provided for each semiconductor element, the chip area can be significantly small.

This structure is particularly preferable in the case where the SOI semiconductor device has output transistors or large-scale logic circuits. This is because an output transistor portion or a large-scale logic circuit portion tends to be large, so that if the circuit block of that portion is divided and is constituted to have the fourth structure, the gettering effect can be obtained effectively, and the chip area can be decreased. When the output transistor is a large current output transistor, the gettering layer 9 can be formed in the periphery of each divided large current output transistor, and the plurality of divided large current output transistors can be operated in parallel. Furthermore, in the case of large-scale logic circuits, the gettering layer 9 can be formed in the periphery of each divided large-scale logic circuit, and the plurality of divided large-scale logic circuits can be connected and operated.

Fifth Structure

Figure 14:
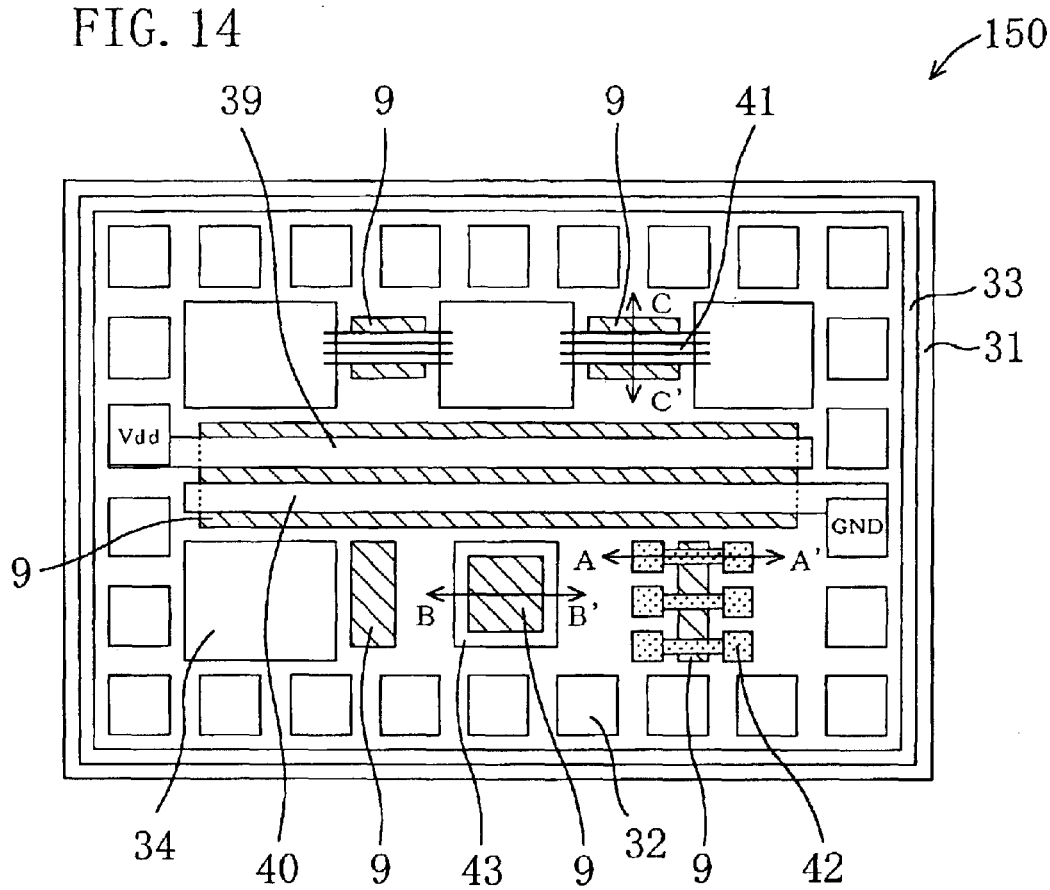
FIG. 14 is a schematic plan view showing a fifth structure of the SOI semiconductor device of Embodiment 2 of the present invention.
Figure 15:
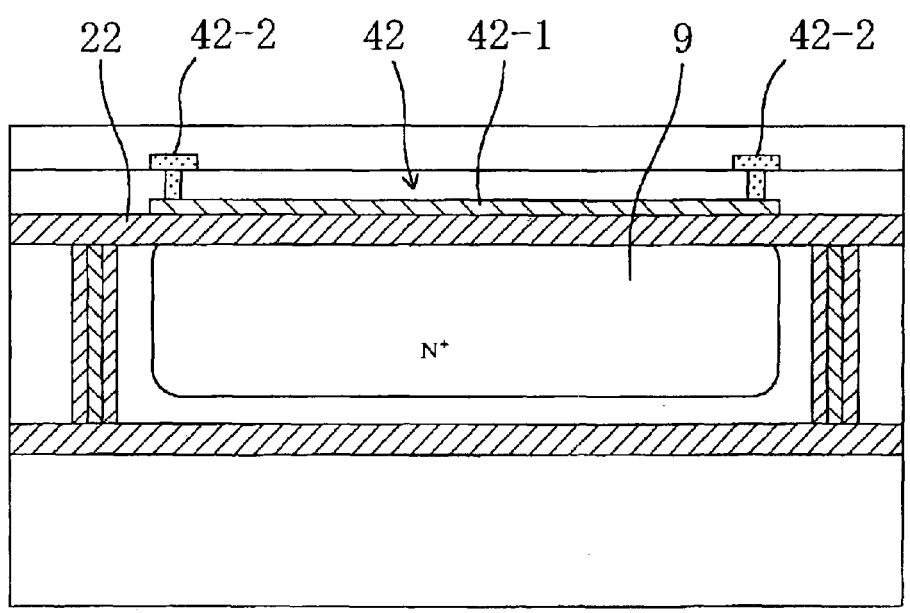
FIG. 15 is a cross-sectional view taken along line A–A' in FIG. 14.
Figure 16:
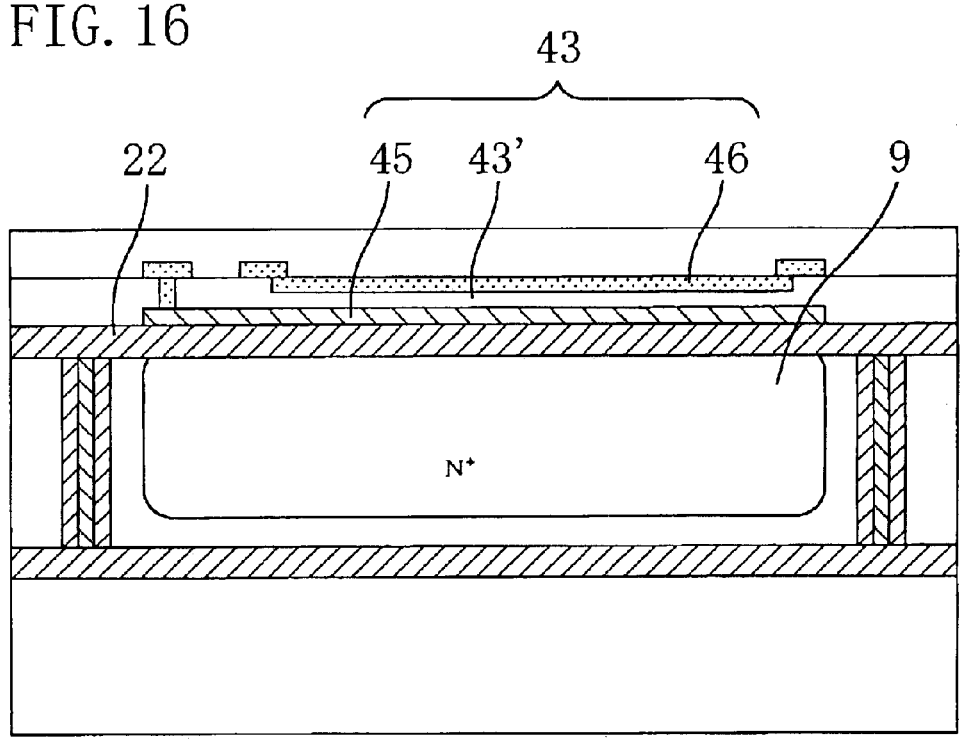
FIG. 16 is a cross-sectional view taken along line B–B' in FIG. 14.

FIG. 14 is a schematic plan view showing a fifth structure of the SOI semiconductor device of this embodiment. FIGS. 15, 16 and 17 are cross-sectional view taken along line A–A', B–B' and C–C' in FIG. 14, respectively. In this structure, the gettering layer 9 is provided below at least one of bus wires, power wires on the high potential side and power wires on the low potential and/or below passive semiconductor elements, which are different from the above-described structures. This structure will be described in greater detail below.

In the example shown in FIG. 14, an SOI semiconductor device 1500 of this structure includes a bus wire 41, a power wire on the high potential side 39, a power wire on the low potential side 40, and passive semiconductor elements (e.g., a resistor 42 and a capacitor 43).

The power wire on the high potential side 39 and the power wire on the low potential side (ground wire) 40 are power wires for supplying power to each of the circuits that are integrated in a semiconductor chip. These power wires are formed on an oxide film covering the SOI active layer of the semiconductor chip 1500 and are connected to a bonding pad for Vdd and a bonding pad for GND of a plurality of bonding pads 32.

In the present invention, the bus wire 41 refers to a wire in which a plurality of wires of only the first or second layer are clustered and bundled in parallel, and it is defined that no semiconductor element is formed in a semiconductor layer directly below a region in which these wires are provided. The bus wire 41 is constituted by a wire in which at least five wire layers are clustered. In general, the bus wire transmits a large number of signals from a circuit block to another or other circuit blocks, so that it can be wired by bundling wires in the number in accordance with the signals. In particular, in a digital circuit using CMOS, the bus wire is used for a plurality of signals to be transmitted mutually between circuit blocks. The wires in the bus wire region are wired such that the wire width and the wire interval are made to be minimum allowed sizes in order to make the area occupied by the wire as small as possible in many cases. However, the wires having the minimum size are not necessarily wired when electrical characteristics such as wavelength attenuation of signals or cross-talk are focused.

If a semiconductor element is formed in a region below the bus wire, the electrode portion of the semiconductor element prevents wiring, so that in general, no semiconductor element is not formed in a region below the bus wire. Therefore, this region is a dead space. Furthermore, the resistor 42 and the capacitor 43, which are passive semiconductor elements, are a polycrystalline silicon resistor and an oxide film capacitor, respectively and are formed on an oxide film of a semiconductor chip, so that the portion of the semiconductor layer directly below the region in which they are provided can be a dead space.

As shown in FIG. 14, the gettering layer 9 is formed below the bus wire 41, the power wire on the high potential side 39 and the power wire on the low potential side 40. It should be noted that the gettering layer 9 is not necessarily formed below all of these wires, but can be formed below either one of them. The gettering layer 9 with respect to the bus wire 41 is shown in FIG. 17 again later.

Furthermore, as shown in FIG. 15, the gettering layer 9 is provided below the polycrystalline silicon resistor 42. The polycrystalline silicon resistor 42 includes a polycrystalline silicon resistor 42-1 formed on a LOCOS oxide film 22 and the polycrystalline silicon resistor 42-1 is connected to a metal electrode 42-2. The polycrystalline silicon resistor 42 is formed on the oxide film 22, so that even if the gettering layer 9 is provided in the semiconductor layer therebelow, the characteristics of the polycrystalline silicon resistor 42 are not affected. Therefore, it is possible to use the region below the resistor 42 as the region for forming the gettering layer 9, and forming the gettering layer 9 in this region can prevent an increase of the chip area.

Furthermore, as shown in FIG. 16, the gettering layer 9 is also provided below the oxide film capacitor 43. The oxide film capacitor 43 includes an oxide film 43', a polycrystalline silicon 45, which will serve as a lower electrode, and an aluminum wire 46 of the first layer, which will be an upper electrode, and is formed on the LOCOS oxide film 22. That is to say, the oxide film 43' is formed on the polycrystalline silicon 45 that will serve as a lower electrode on the LOCOS oxide film 22. The gettering layer 9 is formed below the LOCOS oxide film 22. As in the resistor 42 described above, the oxide film capacitor 43 is also formed on the LOCOS oxide film 22, so that even if the gettering layer 9 is provided in a region below the oxide film capacitor 43, the characteristics of the oxide film capacitor 43 are not affected. Therefore, it is possible to use this region as the region for forming the gettering layer 9, and forming the gettering layer 9 in this region can prevent an increase of the chip area.

Figure 17:
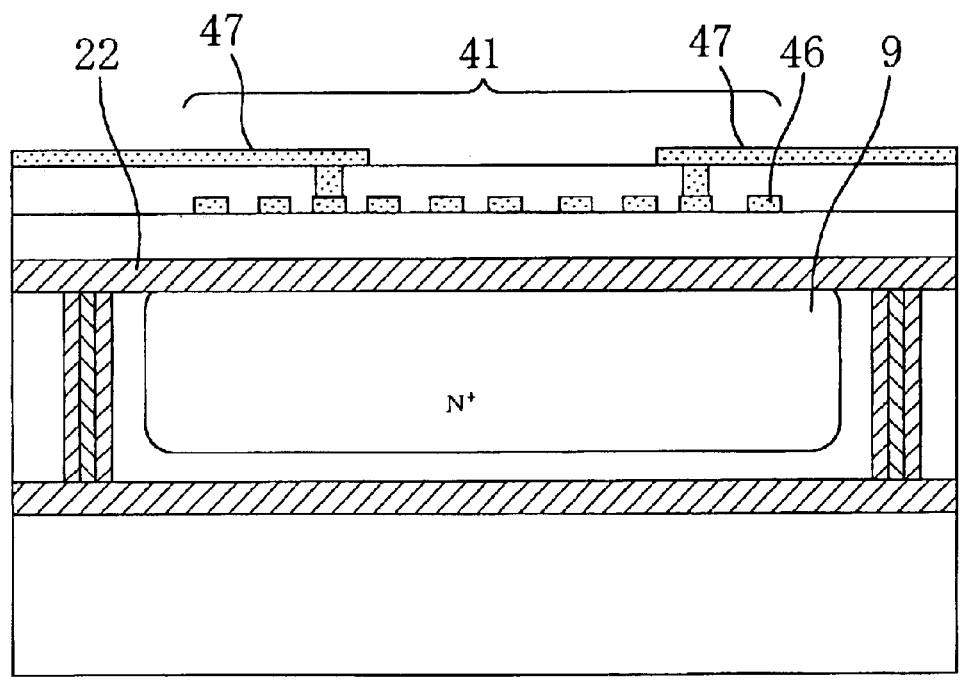
FIG. 17 is a cross-sectional view taken along line C–C' in FIG. 14.

As shown in FIG. 17, the gettering layer 9 is also provided below the bus wire 41. The bus wire 41 is constituted by a plurality of wires 46 of the first layer. Then, wires 47 of the second layer are drawn in the right and the left in the direction orthogonal to the wire 46 and are connected to a plurality of circuit blocks. On the other hand, a bus wire is constituted by the wires 47 of the second layer and signals are drawn from the wire of the first layer. The wires 46 and 47 in FIG. 17 are wires made of aluminum.

As in the elements shown in FIGS. 15 and 16, the bus wire 41 is also formed on the oxide film, so that even if the gettering layer 9 is provided in a region below the bus wire 41, the characteristics of the bus wire are not affected. Therefore, it is possible to use this region as the region for forming the gettering layer 9 and to prevent an increase of the chip area.

As shown in FIGS. 14 through 16, according to this structure, the gettering layer 9 is formed below the passive elements or the wire formed on an oxide film, so that an SOI semiconductor device 1500 in which junction leakage and a reduction of the withstand voltage of the gate oxide film are suppressed can be realized without increasing the chip area. The gettering layer 9 can be not necessarily formed below all the wires and the passive elements but can be partially formed therebelow.

The structures of the present invention can be combined mutually, and for example, the first structure and the second or the third structure can be combined. The structure of the first embodiment and a variation example can be applied to each structure of Embodiment 2.

In the above-described embodiments, the gettering layer 9 is formed of a semiconductor layer containing impurities in a high concentration, but the present invention is not limited thereto and a region that can capture heavy metals in the semiconductor layer can be used as the gettering layer. For example, the gettering layer can be formed of a damage layer having lattice defects that can capture heavy metals in the semiconductor layer. Such a damage layer can be formed by implanting ions of oxygen, carbon, silicon, nitrogen or the like onto the semiconductor layer (e.g., the semiconductor layer 3 in FIG. 3A). That is to say, ion implantation onto a predetermined region in the semiconductor layer causes lattice defects in that region, and the damage layer having the lattice defects can be utilized as the gettering layer for capturing heavy metals.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. An SOI semiconductor device comprising at least an SOI substrate including an insulating film and a semiconductor layer formed on the insulating film; and
   an active semiconductor element formed on the semiconductor layer,
   wherein the active semiconductor element is formed in an element formation region surrounded by an isolating region for isolating the semiconductor layer in a form of an island, and
   a gettering layer containing a high concentration impurity is formed in a portion of the semiconductor layer excluding the element formation region in which the active semiconductor element is formed, and the gettering layer is not formed in the element formation region in which the active semiconductor element is formed, wherein
   the SOI semiconductor device is a semiconductor chip,
   at least one power wire of a power wire on a low potential side and a power wire on a high potential side is provided in a peripheral region of the semiconductor chip, and
   the gettering layer is formed in a semiconductor layer positioned directly below the power wire.

2. The SOI semiconductor device according to claim 1, wherein the gettering layer is electrically connected to the power wire.

3. An SOI semiconductor device comprising at least an SOI substrate including an insulating film and a semiconductor layer formed on the insulating film; and
   an active semiconductor element formed on the semiconductor layer,
   wherein the active semiconductor element is formed in an element formation region surrounded by an isolating region for isolating the semiconductor layer in a form of an island, and
   a gettering layer containing a high concentration impurity is formed in a portion of the semiconductor layer excluding the element formation region in which the active semiconductor element is formed, and the gettering layer is not formed in the element formation region in which the active semiconductor element is formed, wherein
   the SOI semiconductor device has a wafer structure including a plurality of semiconductor chip regions, each of which becomes a semiconductor chip when the plurality of semiconductor chip regions are cut, and
   the SOI semiconductor device having the wafer structure includes a scribe lane that is a boundary portion of adjacent semiconductor chip regions and has the gettering layer in at least a portion of the semiconductor layer within the scribe lane.

4. An SOI semiconductor device comprising at least an SOI substrate including an insulating film and a semiconductor layer formed on the insulating film: and
   an active semiconductor element formed on the semiconductor layer,
   wherein the active semiconductor element is formed in an element formation region surrounded by an isolating region for isolating the semiconductor layer in a form of an island, and
   a gettering layer containing a high concentration impurity is formed in a portion of the semiconductor layer excluding the element formation region in which the active semiconductor element is formed, and the gettering layer is not formed in the element formation region in which the active semiconductor element is formed, wherein
   the SOI semiconductor device is a semiconductor chip,
   a plurality of bonding pads are provided along a periphery of the semiconductor chip, and the gettering layer is provided directly below or a peripheral portion of at least one of the plurality of bonding pads.

5. The SOI semiconductor device according to claim 4, wherein the gettering layer is provided directly below a region within 30 μm from an outer edge of the at least one bonding pad, the region including a region within said bonding pad.

6. An SOI semiconductor device comprising at least an SOI substrate including an insulating film and a semiconductor layer formed on the insulating film; and an active semiconductor element formed on the semiconductor layer, wherein the active semiconductor element is formed in an element formation region surrounded by an isolating region for isolating the semiconductor layer in a form of an island, and a gettering layer containing a high concentration impurity is formed in a portion of the semiconductor layer excluding the element formation region in which the active semiconductor element is formed, and the gettering layer is not formed in the element formation region in which the active semiconductor element is formed, wherein the SOI semiconductor device has at least one of a bus wire, a power wire and a ground wire, and the gettering layer is provided below at least one of the bus wire, the power wire and the ground wire.

7. A method for producing an SOI semiconductor device, comprising the steps of:

preparing an SOI substrate including an insulating film and a semiconductor layer formed on the insulating film;

forming a gettering layer containing a high concentration impurity in a portion of the surface of the semiconductor layer excluding an element formation intended region in which an active semiconductor element is to be formed;

selectively introducing an impurity for forming a well in the element formation intended region and then performing a heat treatment so as to form a well;

forming an isolating region surrounding the element formation intended region of the semiconductor layer such that the gettering layer is not included in the element formation intended region; and forming an active semiconductor element in the element formation intended region, wherein the prepared SOI semiconductor device is a wafer including a plurality of semiconductor chip regions, each of which becomes a semiconductor chip when the plurality of semiconductor chip regions are cut, and a boundary portion of adjacent semiconductor chip regions is used as a scribe lane, and the gettering layer is formed in the semiconductor layer within the scribe lane.

* * * * *